(12) United States Patent
Strassenburg-Kleciak

(10) Patent No.: US 9,568,332 B2
(45) Date of Patent: Feb. 14, 2017

(54) NAVIGATION SYSTEM FOR OUTPUTTING A THREE-DIMENSIONAL ROOF STRUCTURE AND GENERATING A DATABASE

(75) Inventor: Marek Strassenburg-Kleciak, Garching (DE)

(73) Assignee: HARMAN BECKER AUTOMOTIVE SYSTEMS GMBH, Karlsbad (DE)

(*) Notice: Subject to any disclaimer, the term of this patent is extended or adjusted under 35 U.S.C. 154(b) by 455 days.

(21) Appl. No.: 13/438,298

(22) Filed: Apr. 3, 2012

(65) Prior Publication Data

US 2012/0253753 A1    Oct. 4, 2012

(30) Foreign Application Priority Data

Apr. 4, 2011  (EP) .................................. 11161049

(51) Int. Cl.
| | | |
|---|---|---|
| *G06F 17/50* | (2006.01) | |
| *G01C 21/36* | (2006.01) | |
| *G06T 17/05* | (2011.01) | |

(52) U.S. Cl.
CPC ....... *G01C 21/3638* (2013.01); *G06F 17/5004* (2013.01); *G06T 17/05* (2013.01)

(58) Field of Classification Search
CPC ...... G06F 17/5004; G06F 17/50; G06T 17/05; G01C 21/3638
USPC ........................................................... 703/1
See application file for complete search history.

(56) References Cited

U.S. PATENT DOCUMENTS

| | | | | |
|---|---|---|---|---|
| 2003/0023412 | A1* | 1/2003 | Rappaport et al. | 703/1 |
| 2006/0061566 | A1* | 3/2006 | Verma et al. | 345/419 |
| 2008/0021683 | A1 | 1/2008 | Rahmes et al. | |
| 2009/0132210 | A1* | 5/2009 | Royan et al. | 703/1 |
| 2010/0114537 | A1* | 5/2010 | Pershing | 703/1 |

FOREIGN PATENT DOCUMENTS

| | | | |
|---|---|---|---|
| CN | 101290222 | A | 10/2008 |
| CN | 101290222 | B * | 3/2011 |
| DE | 10 2006 013 299 | A1 | 9/2007 |
| JP | 2002298162 | A | 11/2002 |
| JP | 2003141567 | A | 5/2003 |
| JP | 2006099582 | A | 4/2006 |
| JP | 2008123319 | | 5/2008 |
| JP | 2009545032 | A | 12/2009 |

OTHER PUBLICATIONS

Hendrickx, Marcel et al., "3D Reconstruction of House Roofs from Multiple Aerial Images of Urban Areas", Sep. 17-19, 1997, 3D Reconstruction and Modeling of Topographic Objects, IAPRS, vol. 32, Part 3—4WS.*

(Continued)

*Primary Examiner* — Cedric D Johnson
(74) *Attorney, Agent, or Firm* — Artegis Law Group, LLP

(57) ABSTRACT

A navigation system has a database storing data for reconstructing three-dimensional roof structures. The data includes information on edges of at least one closed polygon and a type identifier respectively stored in the database for each one of the edges. Each one of the type identifiers is respectively selected from a finite set of type identifiers. Plural planar faces are generated to reconstruct the roof structure. The planar faces are respectively determined such that they pass through an edge of the polygon and have an orientation determined based on the type identifier stored for the edge.

22 Claims, 17 Drawing Sheets

(56) References Cited

OTHER PUBLICATIONS

Shahrabi, Vorgelegt von Babak Ameri, "Automatic Recognition and 3D Reconstruction of Buildings through Computer Vision and Digital Photogrammetry", 2000.*

Vandekerckhove, J. et al., "Semi-Automatic Modeling of Urban Buildings from High Resolution Aerial Imagery", Jun. 22-26, 1998, Computer Graphics International, 1998, IEEE.*

Verma, Vivek et al., "3D Building Detection and Modeling from Aerial LIDAR Data", 2006, IEEE Computer Society Conference on Computer Vision and Pattern Recognition (CVPR '06).*

Gruen, Armin, "TOBAGO—A Semi-Automated Approach for the Generation of 3-D Building Models", 1998, ISPRS Journal of Photogrammetry & Remote Sensing 53, Elsevier, B.V.*

Gruen, Armin et al., "Urban 3-D Mapping for a Hybrid GIS", Dec. 2, 1999, Urban 3D/Multi-Media Mapping.*

European Search Report dated Sep. 16, 2011.

\* cited by examiner

```
p₁, A, α,         p₁₀, f,
p₂, A, α,         p₅, f,
p₉, A, α,         p₆, f,
p₁₀, A, α,        p₇, f
p₇, A, α,
p₈, A, α,
END,
p₂, f,
p₃, f,
p₄, f,
p₉, f,
END
```
← 23

```
p1,A,α,           p10,A,α,
p2,A,α,           p5,A,α,
p9,s,             p6,A,α,
p10,A,α,          p7,A,180°-α
p7,A,α,
p8,s,
END,
p2,A,α,
p3,A,α,
p4,A,α,
p9,A, 180°-α,
END,
```
← 23

$p_1, A, \alpha, p_2, A, \alpha,$
$p_3, A, \alpha, p_4, A, \alpha,$
$p_5, A, \alpha, p_6, A, \alpha,$
$p_7, A, \alpha, p_8, A, \alpha,$
$p_9, A, \alpha, p_{10}, A, \alpha,$
$p_{11}, A, \alpha, p_{12}, A, \alpha,$
$p_{13}, A, \alpha, p_{14}, s,$
$p_{15}, A, \alpha, p_{16}, A, \alpha,$
$p_{17}, A, \alpha, p_{18}, s$

$3dface, p_1, p_2, r_2, r_1,$
$3dface, p_2, p_3, r_6, r_5, r_2,$
$3dface, p_3, p_4, r_{11}, r_8, r_7, r_6,$
$3dface, p_4, p_5, r_{13}, r_{12}, r_{11},$
$3dface, p_5, p_6, r_{13},$
$3dface, p_6, p_7, r_{12}, r_{13},$
$3dface, p_7, p_8, r_9, r_8, r_{11}, r_{12},$
$3dface, p_8, p_9, r_{10}, r_9,$
$3dface, p_9, p_{10}, r_{10},$
$3dface, p_{10}, p_{11}, r_7, r_8, r_9, r_{10},$
$3dface, p_{11}, p_{12}, r_5, r_6, r_7,$
$3dface, p_{12}, p_{13}, r_3, p_{16}, p_{17}, r_2, r_5,$
$3dface, p_{13}, p_{14}, r_4, r_3,$
$3dface, r_4, p_{15}, p_{16}, r_3,$
$3dface, p_{17}, p_{18}, r_1, r_2$

NAVIGATION SYSTEM FOR OUTPUTTING A THREE-DIMENSIONAL ROOF STRUCTURE AND GENERATING A DATABASE

PRIORITY CLAIM

This application claims the benefit of priority of European Patent Application 11 161 049.9, Apr. 4, 2011, which is incorporated by reference.

BACKGROUND OF THE INVENTION

Technical Field

The invention relates to a navigation system having a database storing data for generating three-dimensional structures, a method of outputting three-dimensional structures, and a method of generating a database. The invention relates in particular to such devices and methods in which three-dimensional roof structures may be output using data stored in the database.

Related Art

Optical output devices are widely used in navigation systems. Such output devices may be used for outputting electronic maps. Since electronic maps may be displayed on screens of small and/or portable devices, they have the advantage of being versatile and compact. Data displayed on electronic maps may be easily modified and adapted, e.g., by changing the scale of the map portion displayed, by displaying additional objects that might be of relevance to the user, such as directional arrows indicating a direction change in a navigation system, or by highlighting objects that may be of relevance to the user.

SUMMARY

Three-dimensional maps may be of particular value to the user owing to their high recognition quality. The recognition of an environmental region, such as a street intersection, may be facilitated when a three-dimensional map is output, as compared to a conventional two-dimensional representation. Buildings may be included in three-dimensional maps or city models output to a user.

Owing to the wide variety of roof shapes that exists, it is a considerable challenge to provide databases that store information on the three-dimensional representation of roofs without requiring amounts of storage space that would be prohibitive. In one approach, roof structures may be represented as a set of planar surfaces with each surface being stored in the database as an multiple points (m) located on the planar surface, where m≥3. In this approach, large data volumes may be required to represent the roof structures. Moreover, this approach may be prone to artificial gaps or other errors when generating 3D models from the data, due to mismatch between adjacent planar surfaces.

In another approach, parametric representations may be used that are based on a library of roof types. In this case, one type identifier identifying the roof type and one or several parameter values defining various dimensions may be stored. While this approach in which one of plural possible roof type is defined by an identifier may be implemented with moderate storage space requirements, it suffers from reduced flexibility. Roof libraries will generally be based on the assumption that at least the base surface of the roof is a regular polygon, such as a rectangle. It may be challenging or even impossible to store information on roof structures for more complicated building outlines or to accommodate some roof features, such as dormers, for which no roof primitive is defined in the library.

Therefore a need exists for a need for navigation systems and methods which provide flexibility in describing a wide variety of roof shapes In yet another approach, the two approaches outlined above could be combined with each other. A definition of roof faces by their corner points may be added to a description that is based on a roof library. Thereby, roof structures that do not correspond to one of the primitives in the roof library could also be described by the database, albeit the processing may become complex and storage space requirements may again become large. Accordingly, there is a need for navigation systems and methods which provide flexibility in describing a wide variety of roof shapes. There is also a need for such devices and methods which allow roof structures to be defined in a compact manner and which reduce the risk of errors when generating optical output.

According to an example, a navigation system is provided. The navigation system has an optical output device, a database and a processing device. The database stores data which defines three-dimensional roof structures. The processing device is coupled to the database and is configured to retrieve data defining a three-dimensional roof structure from the database, to reconstruct the three-dimensional roof structure based on the retrieved data and to control the optical output device, and to display the reconstructed roof structure. The retrieved data includes information on edges of at least one closed polygon and a type identifier respectively stored in the database for each one of the edges. Each one of the type identifiers is respectively selected from a finite set of type identifiers. In order to reconstruct the three-dimensional roof structure, the processing device is configured to determine plural planar faces. The plural planar faces are determined such that a planar face respectively passes through an edge of the polygon and has an orientation determined based on the type identifier stored for the edge.

The navigation system provides high flexibility in describing roofs with various foot prints. The method does not require all corner points of faces of the roof structure to be specified and stored in the database. Information on the roof structures is stored such that type identifiers are respectively assigned to individual edges of a polygon, rather than to the roof structure as a whole. Thereby, flexibility is enhanced. The information stored in the database to define roof structures is parametric in the sense that type identifiers and, depending on the respective type identifier, parameter values are assigned to edges of the polygon. It is not required to store coordinates of all corner points of faces of the roof structure. Storage space requirements may thereby be kept moderate.

The finite set of type identifiers may include at least a first type identifier for an ascending roof face and a second type identifier for a planar face oriented normal to a base plane. A number of different type identifiers included in the finite set may be less than a number of edges of the polygon. The type identifier as such may, but does not need to include all information required to determine the orientation of the planar face. For illustration, there may be one type identifier indicative of a roof face which extends upward from the respective edge. The inclination angle may be stored in the database as a separate parameter value. Another type identifier may indicate that the edge extends across a wall face which is upright relative to a base plane. Yet another type identifier may indicate a flat roof which extends from the respective edge towards the interior of the polygon, within the base plane in which the polygon is defined.

The information on the edges of the polygon stored in the database and retrieved from the database may include at least information on an orientation of the edges and on lengths of the edges. This information may be provided in various formats. For example, the coordinates of vertices of the polygon may be stored in the database. The information on the edges of the polygon may include coordinates of the corner points of the polygon. Alternatively, the information on the edges of the polygon may include coordinates of at least one point of the polygon and information on the edge vectors.

The processing device may be configured to compute intersection lines between different planes passing through different edges of the polygon to reconstruct the roof structure. Error problems which could arise from the manual definition of all corner points of a roof face may be mitigated. Further, ridge lines of the roof structure may be computed without requiring coordinates of points on the ridge line to be stored in the database.

The processing device may be configured to compute lines that delimit the planar faces of the reconstructed roof structure at their lower end. To this end, the processing device may retrieve information on an outline of the building. The building outline may be used to restrict all planar faces generated for the polygon at their lower ends in the x-y-plane, i.e., within the base plane.

The retrieved data may include parameter values for at least a fraction of the edges. Each one of the parameter values may respectively be stored in the database for one of the edges of the polygon. The processing device may be configured to reconstruct the roof structure based on the parameter values. Parameter values may be selectively stored, and used by the processing device for reconstructing the roof structure, when the edge has one type identifier but not if the edge has another type identifier. For illustration, for a type identifier indicating that an upright wall face extends upward from edge of the polygon, it may not be required to store a parameter value for the respective edge. For a type identifier indicating that an inclined roof face extends upward from the respective edge, an inclination parameter value may be stored to quantify the inclination.

The processing device may be configured to select a surface texture of the planar faces extending from the respective edge based on the type identifier stored for the edge. This allows wall faces to be textured differently from inclined roof faces. The processing device may be configured to identify an edge of the polygon for which a first type identifier is stored in the database, to retrieve at least one inclination parameter value for the identified edge and to generate an inclined roof face having a planar face. The inclined roof face may be generated such that the planar face passes through the identified edge and has an inclination defined by the inclination parameter value. Thereby, inclined roof faces may be generated using information on the edge of the polygon, in particular on the orientation of the edge, in combination with the first type identifier and a parameter value indicating the inclination angle.

The processing device may be configured to compute sides of the inclined roof face by computing the intersecting line between a plane passing through the edge which has the first type identifier, and other planes passing through other edges of the polygon. The processing device may be configured to compute sides of the inclined roof face by computing the intersection lines between the plane passing through the edge which has the first type identifier and other planes which pass through the adjacent edges of the polygon.

The processing device may be configured to identify a second edge of the polygon for which the first type identifier is stored in the database, to retrieve a second inclination parameter value for the identified second edge, and to compute an intersection line between the roof face and a second roof face. The second roof face may include a second planar face which passes through the second edge and has an inclination defined by the second inclination parameter value. In this manner, ridge lines of the roof structure may be computed. It is not required to store coordinates of points on the ridge line in the database.

The processing device may be configured to determine whether a further inclination parameter value is stored for the identified edge. If a further inclination parameter value is stored for the identified edge, the roof face may be generated as a broken roof face which has a further planar face. The further planar face is parallel to the edge and has a further inclination defined by the further inclination parameter value. At least one displacement parameter value specifying the location of the edge between the two planar faces with different inclinations may be stored in the data base. Using the inclination parameter value and the displacement parameter value, the position of the edge between the planar faces may be determined.

The processing device may be configured to identify an edge of the polygon for which the first type identifier is stored and which has zero length. The processing device may then generate a roof face which is inclined relative to the base plane of the roof structure and which has a lower end oriented orthogonally to the preceding edge of the polygon. By processing edges of zero length in this way, dormers may be reconstructed without requiring additional type identifiers to be defined.

The processing device may be configured to identify an edge of the polygon for which a second type identifier is stored in the database and to reconstruct the roof structure such that it includes a planar face which is oriented normal to a base plane, passes through the identified edge and has an ascending wall edge inclined relative to the base plane. Thereby, wall faces which support inclined roof structures may be output. The processing device may apply a surface texture to a wall face which is different from a surface texture applied to an inclined roof face.

The processing device may be configured to compute an intersection line between a plane and a further plane in order to compute the ascending wall edge. The plane passes through the identified edge to which the second type identifier is assigned and is normal to the base plane. The further plane passes through another edge of the polygon adjacent the identified edge and is inclined relative to the base plane. Thereby, the ascending wall edge may be determined.

The processing device may be configured to identify edges of the polygon for which a third type identifier is stored in the database and to reconstruct the roof structure such that it includes a flat roof enclosed by the identified edges of the polygon. Thereby, flat roofs may be displayed in three-dimensional maps. By using a polygon to define the flat roof, in combination with the third type identifier assigned to edges of the polygon, a wide variety of shapes of flat roofs may be taken into account. The processing device may apply a surface texture to a flat roof which is different from a surface texture applied to inclined roof faces or wall faces.

The finite set of type identifiers may include three or less different type identifiers. For illustration, for each edge of a polygon in a base plane of a roof structure, the type identifier stored in the database may be selected from a set consisting of a first, second and third type identifier. By using two or three type identifiers, a large number of roof structures may still be stored and displayed. The data may be processed using generic processing steps for such a limited number of type identifiers.

The polygon may be disposed in a base plane, i.e. foot plane, of the roof structure. The database may be a relational database. At least the type identifiers assigned to the edges of the polygon may be stored as attributes in the relational database. The database may be a map database in accordance with the Navigation Data Standard (NDS). The navigation system may be a vehicle navigation system. The vehicle navigation system may be removably or fixedly installed in a vehicle.

According to another aspect, a method of outputting a three-dimensional roof structure via an optical output device of a navigation system is provided. Data representing a three-dimensional roof structure is retrieved from a database. The retrieved data includes information on edges of at least one closed polygon and a type identifier respectively stored in the database for each one of the edges. Each one of the type identifiers is selected from a finite set of type identifiers. The three-dimensional roof structure is reconstructed based on the information on the edges and the type identifiers for the edges. For reconstruction, plural planar faces are determined such that the planar face respectively passes through an edge of the polygon and has an orientation determined based on the type identifier stored for the edge. The optical output device is controlled to display the reconstructed roof structure.

The method provides high flexibility in describing roofs with various foot areas. The method does not require all corner points of faces to be specified and stored in the database. The finite set of type identifiers may include at least a first type identifier for an ascending roof face and a second type identifier for a planar face oriented normal to a base plane. A number of different type identifiers included in the finite set may be less than a number of edges of the polygon.

The retrieved data may include parameter values for at least a fraction of the edges. Each one of the parameter values may respectively be stored in association with one of the edges of the polygon. Reconstructing the roof structure may be performed further based on the parameter values.

When reconstructing the roof structure, an edge of the polygon may be identified for which a first type identifier is stored in the database. At least one inclination parameter value for the identified edge may be retrieved. An inclined roof face having a planar face may be generated such that the planar face passes through the identified edge and has an inclination defined by the inclination parameter value.

A second edge of the polygon may be identified for which the first type identifier is stored in the database. A second inclination parameter value stored for the identified second edge may be retrieved. An intersection line between the roof face and a second roof face may be computed. The second roof face may include a second planar face which passes through the second edge and has an inclination defined by the second inclination parameter value.

Reconstructing the roof structure may include determining whether a further inclination parameter value is stored for the identified edge. If a further inclination parameter value is stored for the identified edge, the roof face may be generated as a broken roof face which has a further planar face. The further planar face may be parallel to the edge of the polygon and may have a further inclination defined by the at least one further inclination parameter value.

Reconstructing the roof structure may include identifying an edge of the polygon for which a second type identifier is stored in the database. The roof structure may be reconstructed such that it includes a planar face which is oriented normal to a base plane, passes through the identified edge and has an ascending wall edge inclined relative to the base plane.

Reconstructing the roof structure may include computing an intersection line between a plane and a further plane in order to compute the ascending wall edge. Here, the plane passes through the identified edge and is normal to the base plane, and the further plane passes through another edge of the polygon adjacent the identified edge and is inclined relative to the base plane.

Reconstructing the roof structure may include identifying edges of the polygon for which a third type identifier is stored in the database. The roof structure may be reconstructed such that it includes a flat roof enclosed by the identified edges of the polygon.

The method of outputting three-dimensional roof structures according to any one aspect or embodiment may be performed using the navigation system of any one aspect or embodiment. According to another aspect, a method of generating a navigation database is provided. The navigation database is generated such that it includes a parametric description of roof structures. Data representing a three-dimensional roof structure are retrieved. Based on the data, at least one closed polygon is identified which includes a plurality of edges in a base plane of the roof structure. For each edge of the plurality of edges, a type identifier selected from a finite set of type identifiers is assigned to the edge based on a position of the edge relative to roof faces of the roof structure. Based on the assigned type identifier, a parameter value for the respective edge may selectively be determined from the data. Information on the edges of the polygon and on the type identifiers assigned to each of the edges is stored in the database.

Using this method, a database may be generated which includes information for reconstructing and outputting three-dimensional roof structures. It is not required to store all corner points of roof faces in the database. Rather, a parametric description of roof faces is used. Type identifiers are assigned to individual edges of the polygon rather than to the roof structure as a whole, which allows a wider variety of roof structures to be stored.

The set of type identifiers may include a first type identifier, a second type identifier, and a third type identifier. The first type identifier may be assigned to an edge of the polygon if the edge extends along a lower end side of an inclined roof face. The second type identifier may be assigned to an edge of the polygon if the edge extends across a wall face having an ascending wall edge to support a roof face. The third type identifier may be assigned to an edge of the polygon if the edge extends along a side of a flat roof face.

While aspects and embodiments are described in the context of navigation systems, according to further aspects and embodiments, the methods and devices may be used for outputting three-dimensional roof structures also in other applications. For illustration, the methods and devices may be used to reconstruct and output three-dimensional roof structures via the optical output device of any electronic device or application in which three-dimensional city models are to be output.

It is to be understood that the features mentioned above and those to be explained below can be used not only in the respective combinations indicated, but also in other combinations or in isolation. Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The foregoing and other features of embodiments will become more apparent from the following detailed description of embodiments when read in conjunction with the accompanying drawings. In the drawings, like reference numerals refer to like elements.

FIG. 17 illustrates data with a parametric description of the roof structure of FIG. 16.

FIG. 18 illustrates data with a conventional description of the roof structure of FIG. 16.

DETAILED DESCRIPTION OF THE PREFERRED EMBODIMENTS

Figure 1:
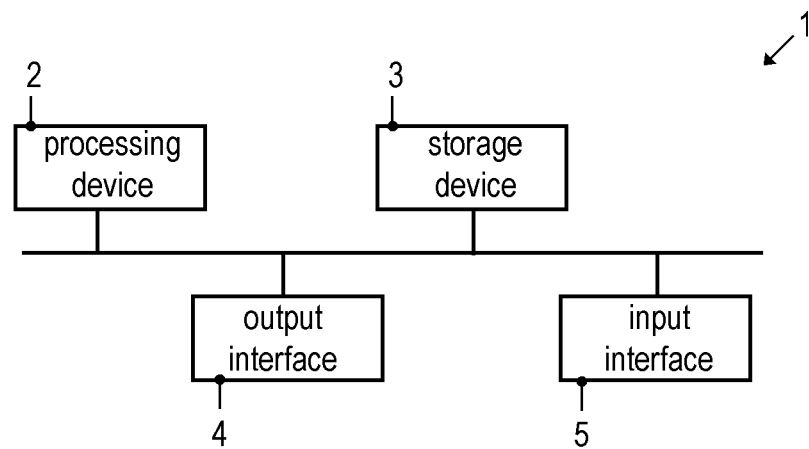
FIG. 1 is a schematic block diagram of a navigation system.

FIG. 1 schematically illustrates a navigation system 1 according to an embodiment. The navigation system 1 may include a processing device 2 controlling the operation of the navigation system 1. The processing device 2 may have a central processing unit, for example in form of one or more microprocessors, digital signal processors or application-specific integrated circuits. The processing device 2 may also include a graphics processor. The navigation system 1 may further include a map database stored in a storage device 3. The storage device 3 may comprise any one, or any combination, of various types of memory, such as random access memory, flash memory or a hard drive, but also removable memories such as a compact disk (CD), a DVD, a memory card or the like. The navigation system 1 also may include an output interface 4 for outputting information to a user. The output interface 4 may include an optical output device. The navigation system 1 may also include an input interface 5.

The navigation system 1 may include additional components, such as a position sensor and/or a wireless receiver and/or a vehicle interface. The position sensor may be adapted to determine the current position of the vehicle in which the navigation system 1 is installed. The position sensor may comprise a GPS (Global Positioning System) sensor, a Galileo sensor, a position sensor based on mobile telecommunication networks and the like. The wireless receiver may be configured to receive information for updating the map database stored in the storage device 3. The vehicle interface may allow the processing device 2 to obtain information from other vehicle systems or vehicle status information via the vehicle interface. The vehicle interface may for example comprise CAN (controller area network) or MOST (Media Oriented devices Transport) interfaces.

The storage device 3 stores a map database comprising map data. The map database may include information for performing route search. In addition, the map database also includes information for outputting three-dimensional (3D) maps. The map database includes information on roof structures which allows roof structure to be reconstructed by the processing device 2. The processing device 2 controls the output interface 4 such that three-dimensional roof structures are output.

As will be explained in more detail in the following, the map database 3 stores parametric descriptions of roof structures. For a roof structure, information on one or more closed polygons is respectively stored in the map database 3. The polygon includes a plurality of edges. The polygon may be located in a base plane, or foot plane, of the roof structure. The map database 3 further stores, for each of the edges, a type identifier which is selected form a finite set of type identifiers. For illustration, three different type identifiers may be used to indicate that an edge of the polygon extends along an ascending roof face, or that the edge of the polygon extends across a wall face having ascending wall edges, or that the edge of the polygon extends along a side of a flat roof.

Depending on the type identifier assigned to the respective edge, the map database 3 may also include one or more parameter values assigned to the edge. For illustration, when a first type identifier indicating that the edge of the polygon extends along the lower side of an ascending roof face is stored, at least one parameter value may be stored in the map database for the respective edge. When a second type identifier indicating that the edge extends on a wall face having ascending roof faces, no parameter values may have to be stored for the respective edge.

The processing device 2 is configured to reconstruct the 3D roof structure based on the information on the edges of the polygons, the respectively stored type identifiers and, where applicable, the stored parameter values. Reconstructing the 3D roof structure may involve any processing which is suitable for supplying the data to a 3D rendering procedure. For illustration, the processing device 2 may compute intersection lines between different planes passing through different edges of the closed polygon. Thereby, coordinates of the vertices of 3D faces or a voxel lattice may be computed, which may be supplied to a rendering process.

The map database stored in the memory 3 may include different logical layers. Additionally, the map database may be split into different blocks which are associated with different update regions or tiles of a tiling. Such a structure facilitates performing updates. This is particularly desirable for performing updates of the map database to adjust the map database to local changes, for example to new buildings. Such updates may then be performed by updating only the update regions or tiles affected by changes in the road network. This allows the updates to be more readily performed in a more time-efficient manner or as over-the-air updates.

Figure 2:
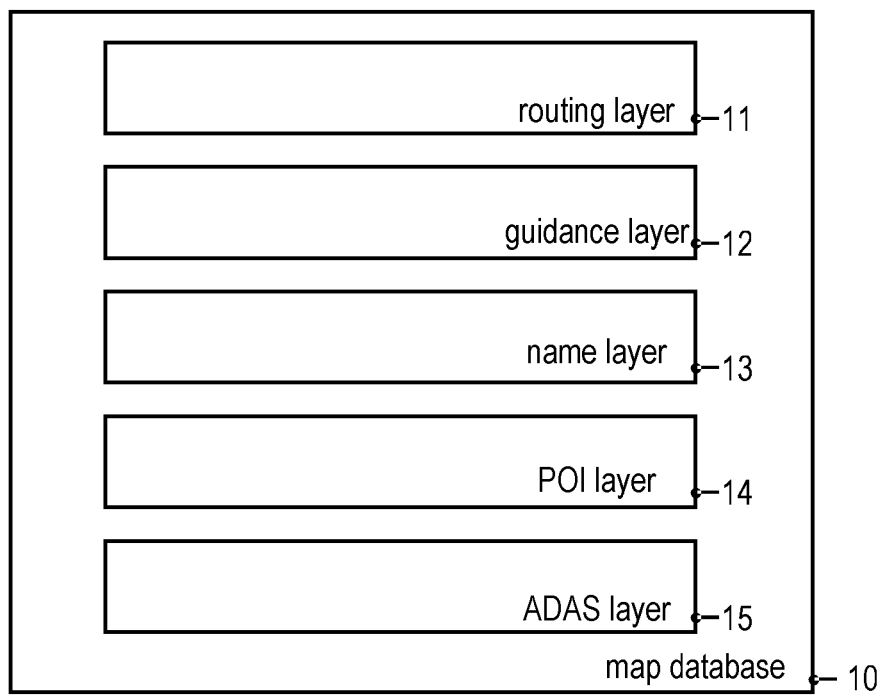
FIG. 2 is a schematic representation of a map database.

FIG. 2 is a schematic representation of a map database 10. A map database 10 having the structure explained in the following may be stored in the storage device 3 of the navigation system 1. The map database 10 includes a plurality of layers 11-15. The layers may include a routing layer 11 which stores the information required for performing route searches and a guidance layer 12 which stores data required for route guidance. The map database 10 may include additional layers 13-15. A name layer 13 may include references to road names, house numbers or similar. A point of interest (POI) layer 14 may include information on points of interest. An Advanced Driver Assistance System (ADAS) layer 15 may include data for Advanced Driver Assistance. Additional or alternative layers may be provided, such as a truck layer including specific information for trucks or lorries, a layer for phonetic representations, or a layer for basic map display.

The map database 10 may be configured as a relational database. At least one of the layers of the database, such as the POI layer 14 or the guidance layer 12 may include information on roof structures. This information is used for outputting city models which include 3D representations of roof structures.

Figure 3:
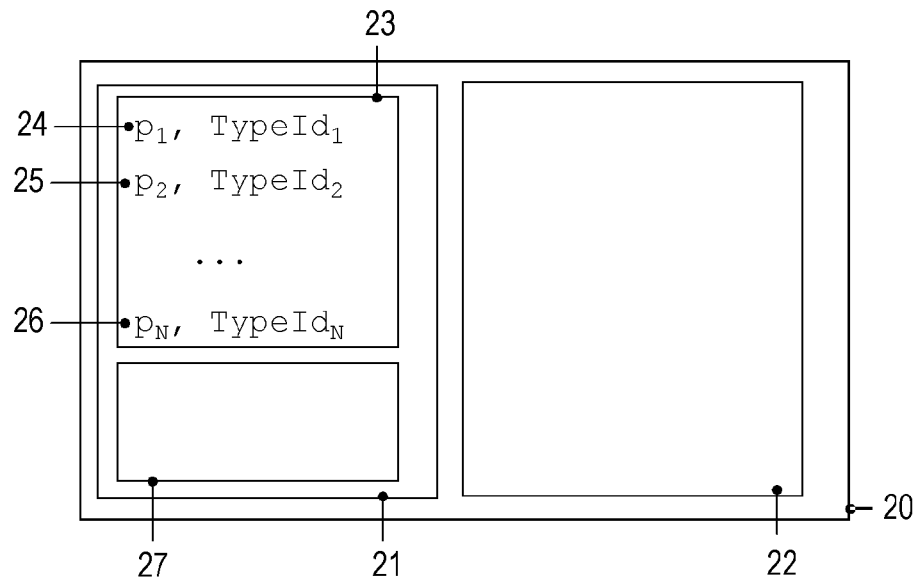
FIG. 3 is a schematic representation of data relating to roof structures in a map database.

FIG. 3 is a schematic representation of data 20 used for outputting roof structures. The data 20 may be stored in the storage device 3 of the navigation system 1. The data 20 includes data 21 representing a roof structure and data 22 representing another roof structure. The data 21, 22 representing a roof structure may respectively include information on edges of one or more polygons, type identifiers stored as attributes for the edges, and parameter values which may optionally be stored, depending on the respective type identifier, for some of the edges. The type identifiers are respectively selected from a finite set of type identifiers. For illustration, finite sets of three type identifiers may be used.

The data 21 representing a roof structure includes data 23 associated with a closed polygon. Data 27 associated with one or more additional closed polygons may be included in the data 21. The data 23 associated with a closed polygon includes information on edges of the closed polygon. The closed polygon may be defined in a base plane, i.e. foot plane, of the roof structure. The information on the edges may take various forms. In one implementation, coordinates of the vertices $p_1, p_2, \ldots, p_N$ of the polygon may be included in the database. While such a format for storing information on edges of the polygon will be illustrated in some embodiments, any other suitable format may also be used. For illustration, the information on the edges of the polygon may include coordinates of one of the corner points, $p_1$, and information specifying the orientation of all edges relative to the preceding corner point, i.e. $p_2$-$p_1$, $p_3$-$p_2$, etc. Alternatively, the information on the edges of the polygon may include coordinates of one of the corner points, $p_1$, and information defining the location of all other corner points relative to the one corner point, i.e. $p_2$-$p_1$, $p_3$-$p_1$, etc.

The data 23 includes type identifiers assigned to each one of the edges of the closed polygon. The type identifiers may be stored in any suitable manner which allows the correspondence between type identifiers and edges of the polygon to be established. For illustration, a type identifier TypeId$_i$ for an edge extending from corner point $p_i$ to a corner point $p_{i+1}$ may be stored as an attribute for the coordinates of the corner point $p_i$. This is illustrated for rows 24-26 of the data 23. The type identifiers TypeId$_i$ are respectively selected from a finite set of possible type identifiers. The set may include three different type identifiers. Any other structure which allows a correspondence between type identifiers and edges of the polygon to be established may also be used. For illustration, while a data block 23 including coordinates of corner points of the polygon and type identifiers for edges is illustrated in FIG. 3, separate tables may be used for storing corner point coordinates and type identifiers for edges.

The data 23 may also include one or more parameter values for an edge of the polygon. Parameter values do not need to be present for each type identifier. Parameter values may be stored at least for edges which have a type identifier indicating that the edge is disposed at the lower end side of ascending roof faces. Such a parameter value may quantify an inclination.

As will be explained in more detail with reference to FIGS. 4-30, three different type identifiers may be used. Different numbers of type identifiers may be used, as long as there is only a finite set of type identifiers. A first type identifier, also referred to as "A", may be assigned to edges which located at the lower end side of an ascending, inclined roof face. A second type identifier, also referred to as "s", may be assigned to edges which pass along a wall face having slanted wall edges to support a roof face. A third type identifiers, also referred to as "f" may be assigned to edges which enclose a flat roof. In other words, three type identifiers may be used which correspond to inclined, vertical or horizontal roof faces.

By assigning type identifiers to individual edges, a high degree of flexibility is attained. This allows a wide variety of roof structures to be described. The computation of intersection lines between different planar faces may be made on demand when outputting roof structures. Errors arising from pre-defined intersection lines which do not fully match may be mitigated.

Figure 4:
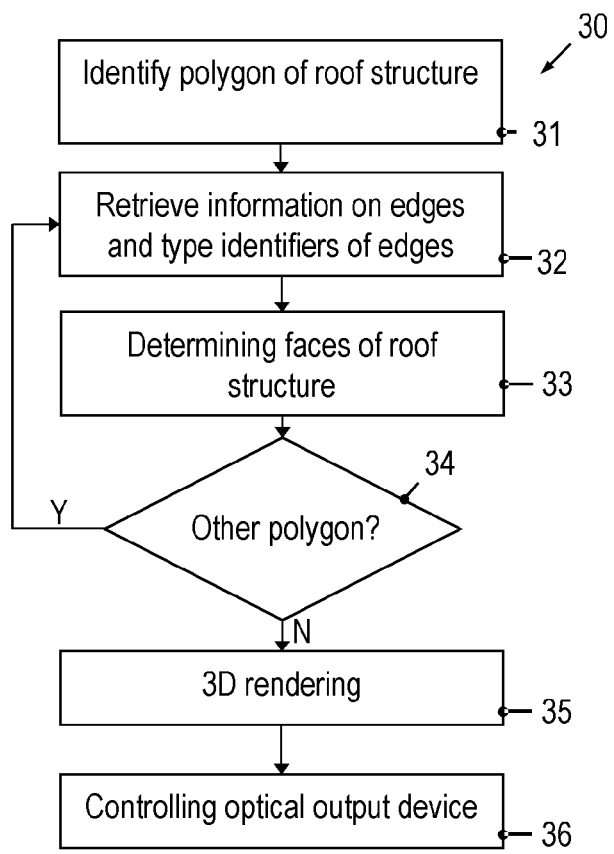
FIG. 4 is a flow chart of a method of outputting a roof structure.

FIG. 4 is a flow chart of a method 30 of outputting roof structures. The method 30 may be performed by the processing device 2 of the navigation system 1. The processing device 2 may control the output interface 4 for optically outputting a reconstructed 3D roof structure.

In the method of FIG. 4, a roof structure is reconstructed from the data stored in the database. The data includes information on edges of a polygon, type identifiers assigned to the edges and parameter values at least for edges having a given one of the type identifiers. According to general terminology in this field, the term "reconstructing" or "reconstruction" is used to refer to a process in which the data stored in the database are processed so as to generate data suitable for 3D rendering. For illustration, in some embodiments, the corner points of all planar faces of the roof structure may be computed from the data in the database for reconstructing the roof structure. In some embodiments, a voxel lattice may be generated. In either case, the data may be supplied to a 3D rendering procedure.

At act 31, a polygon associated with the roof structure is identified. The database may be organized such that, for any building or any roof structure, it includes information on the various polygons defined in the base plane of the roof structure.

At act 32, information on edges of the closed polygon and type identifiers stored for the edges are retrieved. The information can have various forms and may include coordinates of corner points of the polygon, coordinates of edge vectors of the polygon, information on lengths and orientations of the edge vectors in the base plane, or any combination of such data which allows the position and orientation of the edges to be determined. The stored type identifiers are respectively selected from a finite set of possible type identifiers, that is each one of the type identifiers has a value that is selected from a finite set of possible values. Depending on the respective type identifier, parameter values may be stored for the respective edge. If parameter values are stored for the edge, the parameter values may also be retrieved at act 32.

At act 33, several planar faces defining the roof structures may be determined. The planar faces may include "ascending" roof faces inclined relative to the plane in which the polygon is defined, wall faces perpendicular to the plane in which the polygon is defined, and "flat" roofs extending in the plane in which the polygon is defined. Determining the planar faces may be done in various ways. Intersections between planes may be computed which pass through different edges of the polygon. The planes may respectively have an orientation relative to the plane in which the polygon is defined that is determined by the type identifier for the respective edge and, if applicable, parameter values for the respective edge. Determining the planar faces may also include determining a voxel lattice of points located within the roof structure.

At act 34, it is determined whether the data representing the roof structure includes data associated with at least one further polygon. If the data representing the roof structure includes data associated with at least one further polygon, acts 32 and 33 are repeated for the further polygon. Otherwise, the method proceeds to act 35.

At act 35, a 3D rendering is performed. The 3D rendering may be performed based on information on corner points of planar faces or a 3D voxel lattice determined at act 33. At act 36, the optical output device is controlled such that a 3D representation of the roof structure is output.

In order to reconstruct the 3D roof structure from the parametric description stored in the database, in which type identifiers and, where applicable, parameter values are assigned to edges of a closed polygon, intersection lines of planes passing through edges of the polygon may be computed. A corresponding procedure is shown in FIG. 5.

Figure 5:
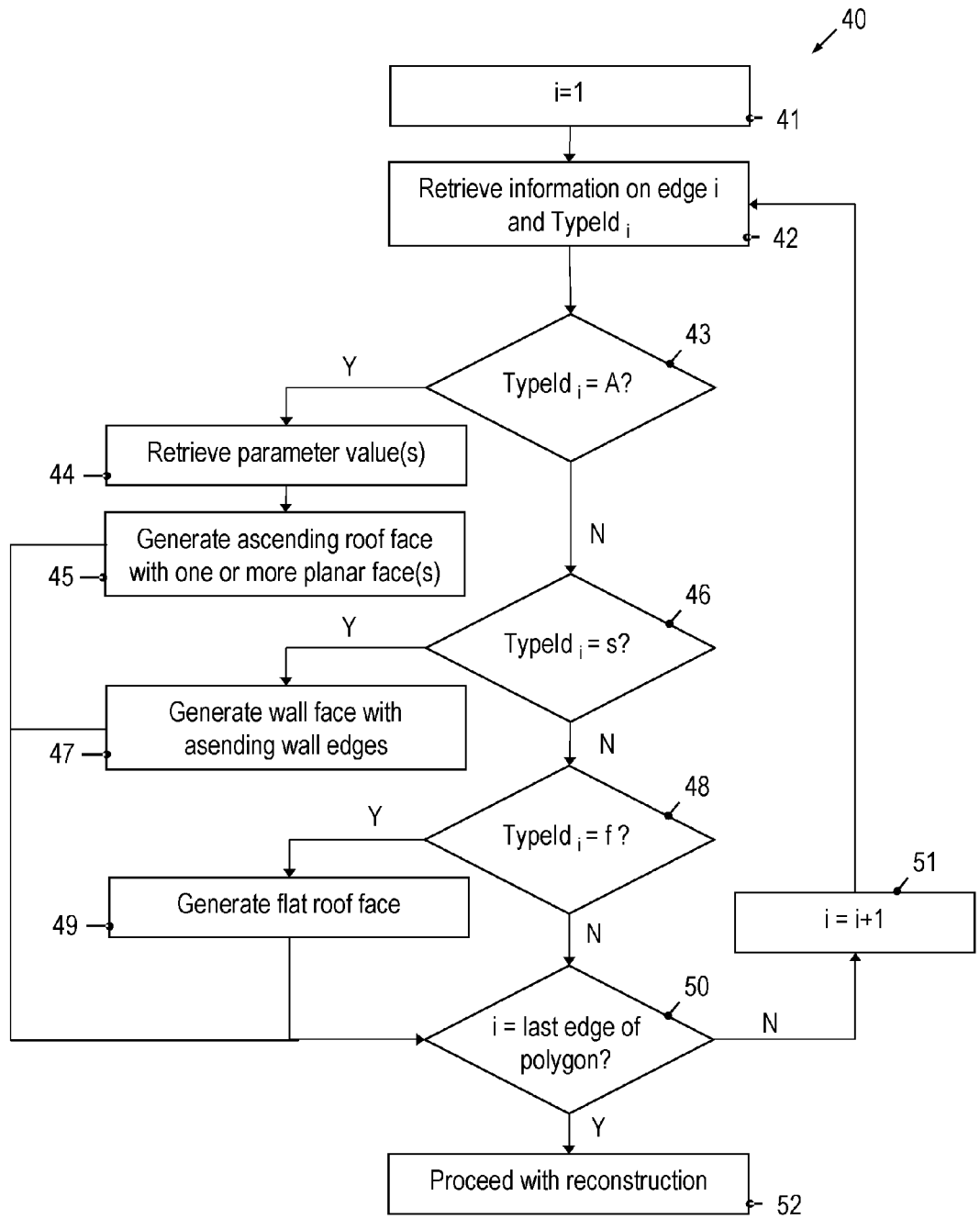
FIG. 5 is a flow chart of a procedure of reconstructing a roof structure in a method of outputting the roof structure.

FIG. 5 is a flow chart of a procedure 40 for reconstructing a 3D roof structure. The procedure 40 may be performed by the processing device 2 of the navigation system 1. The procedure 40 may be performed to implement act 33 of method 30.

At block 41, an iteration over edge indices i is initialized. At act 42, information on the $i^{th}$ edge of the polygon and the type identifier TypeId$_i$ for the $i^{th}$ edge are retrieved. At act 43, it is determined whether the type identifier TypeId$_i$ is a first type identifier, i.e. has value "A". If the type identifier TypeId$_i$ has value "A", at act 44, one or more parameter values stored in the database for the edge are retrieved. At act 45, an ascending roof face is generated which passes through the edge i of the closed polygon. The roof face is generated to include at least one planar face which has an inclination relative to the base plane of the roof structure determined by the parameter value(s) retrieved at act 44. The method then proceeds to act 50.

If the type identifier TypeId$_i$ does not have value "A", at act 46, it is determined whether the type identifier TypeId$_i$ is a second type identifier, i.e. has value "s". If the type identifier TypeId$_i$ has value "s", at act 47, a wall face perpendicular to the base plane is generated. The wall face may have an ascending wall edge on which a roof face is supported. The method then proceeds to act 50.

If the type identifier TypeId$_i$ does not have value "s", at act 48, it is determined whether the type identifier TypeId$_i$ is a third type identifier, i.e. has value "f". If the type identifier TypeId$_i$ has value "f", at act 49, a flat roof extending in the base plane of the roof structure is generated. The method then proceeds to act 50.

At act 50, it is determined whether the iteration over edges of the polygon has reached the last edge of the polygon. If the edge is not the last edge of the polygon, it is incremented at act 51. The method returns to act 42.

If the iteration over edges of the polygon has reached the last edge, at act 52, the reconstruction may be continued. To this end, intersection lines between the ascending roof faces generated at act 45 and wall faces generated at act 47 may be determined, or one or more ridge lines of the roof structure may be determined using the roof faces generated at act 45 for different edges of the polygon.

While the determination step at act 48 is shown in FIG. 5 for better illustration, this determination step may also be omitted. When there is only a finite set of type identifiers, the type identifier for an edge may be concluded to have one of the possible values if it has previously been determined that it does not have any of the other possible values.

While a "generation" of different faces is shown at acts 45, 47 and 49 in the procedure 40, such a generation is understood herein to be a process in which the location and orientation of a face is determined, without requiring the face to be actually output. Further, a surface texture of the respective face may also be determined.

While the procedure 40 has been illustrated in the context of an iteration over edges of the closed polygon, generating the various faces (ascending roof face, wall face, flat roof) may also be performed only after the information on all edges, type identifiers and, where applicable, parameter values has been retrieved. The different faces may be generated using not only the information on the orientation and type identifier for one edge, but using the information on other edges, associated type identifiers and parameter values. For illustration, and as will be explained in more detail below, in order to determine the outer boundaries of an ascending roof face, an intersection line of plural ascending roof faces or of an ascending roof face and a wall face may be computed.

Figure 6:
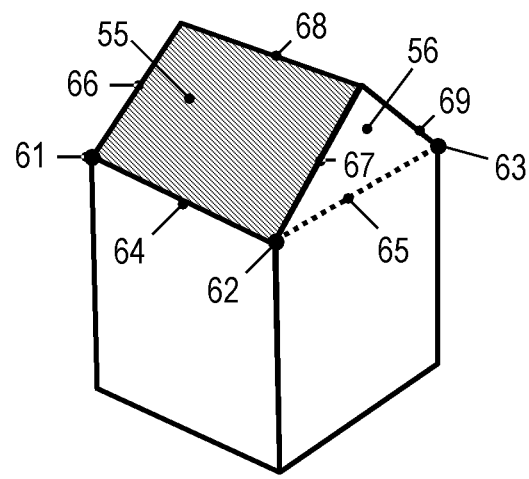
FIG. 6 is a schematic view for illustrating type identifiers assigned to edges of a polygon.

FIG. 6 is a schematic perspective view illustrating the reconstruction of a roof structure. A polygon includes four corners, i.e. vertices. Three corners 61-63 can be seen in FIG. 6. An edge 64 extends from the first corner 61 to the second corner 62. Another edge 65 extends from the second corner 62 to the third corner 63. The polygon includes two additional edges which are hidden in FIG. 6. The polygon with edges 64, 65 is defined in a base plane of the roof structure.

The type identifier stored for the edge 64 has the value "A" indicating that the edge 64 extends along the lower side of an ascending roof face. The type identifier stored for the edge 65 has the value "s", indicating that the edge 65 extends on a wall face oriented normal to the plane in which the polygon is defined and having ascending wall edges. The type identifier stored for the edge from the third corner point 63 to the fourth corner point (not shown in FIG. 6) has the value "A" indicating that the edge extends along the lower side of an ascending roof face. The type identifier stored for the edge extending from the fourth corner point (not shown in FIG. 6) to the first corner point 61 has the value "s", indicating that the edge extends on a wall face. The data describing the roof structure further includes an inclination parameter value for each edge having type identifier "A". This parameter value quantifies the inclination of the ascending roof face.

Using this description of the roof structure, the faces 55, 56 of the roof structure may be generated for reconstruction of the roof structure. By definition, the edge 64 of the polygon is located at the lower side of the ascending roof face 55. The lateral side 67 of the ascending roof face 55 may be determined as intersection line of a plane passing through the edge 64 and inclined in accordance with the inclination parameter value for edge 64 and a vertical plane passing through the edge 65. The lateral side 66 of the ascending roof face 55 may be determined as intersection line of the plane passing through the edge 64 and inclined in accordance with the inclination parameter value for edge 64 and a vertical plane passing through the edge of the polygon from the fourth corner point to the first corner point 61. The ridge line 68 which defined the upper end of the ascending roof face 55 may be determined as intersection line of planes passing through the edges having type identifier "A" and respectively inclined in accordance with the associated inclination parameter value stored in the database.

Similarly, in order to generate the wall face 56, the ascending wall edges 67 and 69 may be determined as intersection lines between a vertical plane passing through edge 65 and inclined planes passing through the adjacent edges of the polygon. For illustration, the ascending wall edge 67 may be determined as interaction line between the vertical line passing through edge 65 and a plane passing through edge 64 and inclined relative to the base plane of the roof structure in accordance with the inclination parameter value stored for edge 64. Using the parametric description of the roof structure, transection edges between the different faces, including the ridge line 58, may be determined.

Figure 7:
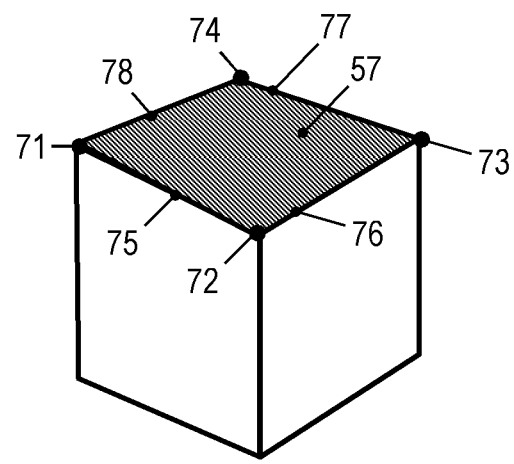
FIG. 7 is a schematic view for illustrating another type identifier assigned to edges of a polygon.

FIG. 7 is a schematic perspective view illustrating the reconstruction of a roof structure. A polygon includes four corners 71-74. A first edge 75 extends from the first corner 71 to the second corner 72. A second edge 76 extends from the second corner 72 to the third corner 73. A third edge 77 extends from the third corner 73 to the fourth corner 74. A fourth edge 78 extends from the fourth corner 74 to the first corner 71. The polygon is defined in a base plane of the roof structure.

The type identifier stored for each one of the edges 75-78 has the value "f" indicating that the edges 75-78 enclose a flat roof. Optionally, a parameter value indicating zero inclination relative to the base plane may also be stored in the parametric description of the roof structure. This may facilitate processing of edges with type identifiers "f" and "A" using more generic procedures. When reconstructing the roof structure, a face 57 representing a flat roof enclosed by the closed polygon is generated.

For each one of the type identifiers, the type identifier may not only be used to determine the orientation of a roof face relative to the plane in which the polygon is located, but may also be used to determine a surface texture. For an edge having a first type identifier "A" indicating that the roof face is an ascending roof face, a surface texture may be applied to the roof face which is different from a surface texture applied to a wall face extending from an edge having the type identifier "s". Yet another surface texture may be applied to a flat roof face.

Figure 8:
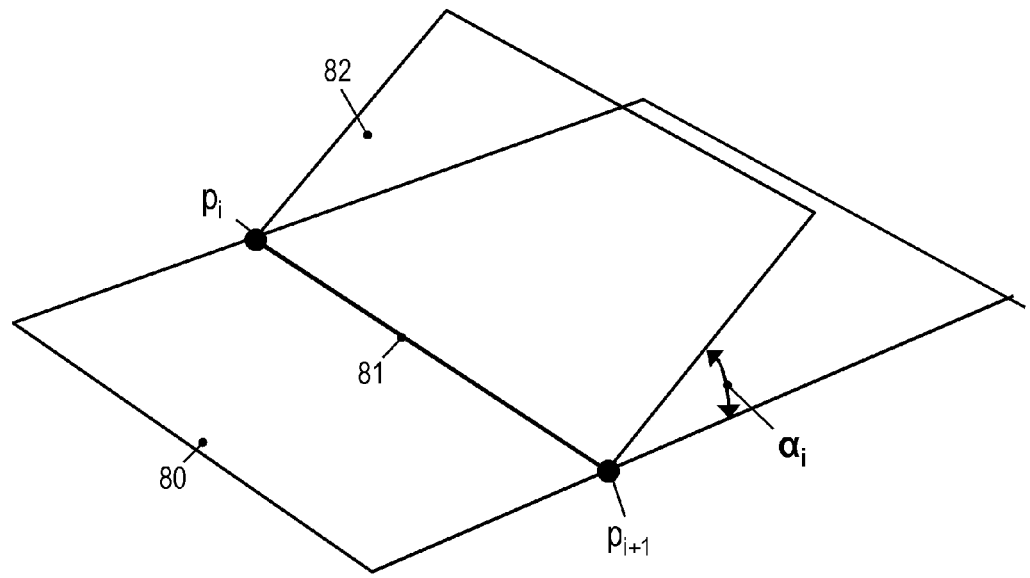
FIGS. 8 and 9 are schematic views for illustrating the generation of ascending roof faces.
Figure 9:
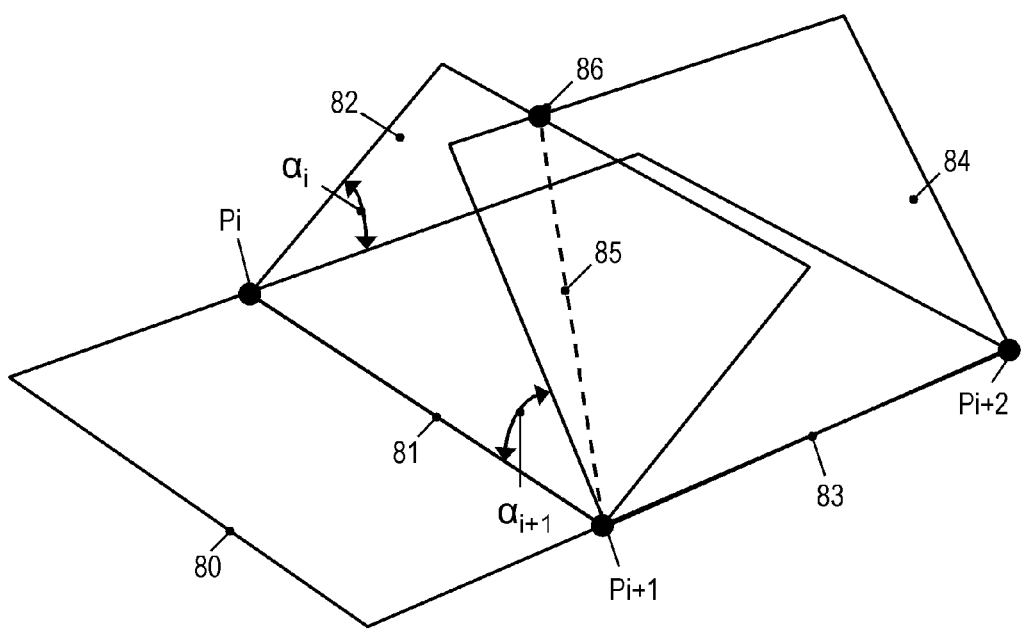

FIGS. 8 and 9 illustrate the processing of the parametric description for reconstructing the roof structure. A closed polygon having vertices $p_i$ and $p_{i+1}$ is defined in a base plane 80 of the roof structure. An edge 81 of the polygon extends from vertex $p_i$ to vertex $p_{i+1}$. An inclination parameter value indicating the inclination $\alpha_i$ of an ascending roof face 82 is stored for edge 81 in the parametric description of the roof structure if the edge 81 has the first type identifier "A". The inclination parameter value $\alpha_i$ may be stored in any one of a variety of forms. For illustration, the inclination angle $\alpha_i$ itself may be stored in the parametric description. In another implementation, $\tan \alpha_i$ may be stored in the parametric description. Using $\tan \alpha_i$, the inclination of the ascending roof face may also be readily determined. The inclination angle $\alpha_i$ may be defined in the interval from 0° to 180°. A value of less than 90° may indicate that the roof face is inclined towards the interior of the closed polygon. A value of greater than 90° may indicate that the roof face is inclined towards the exterior of the closed polygon.

Referring to FIG. 9, the polygon includes a further corner point $p_{i+2}$. Another edge 83 of the polygon extends in the base plane 80 from corner point $p_{i+1}$ to corner point $P_{i+2}$. A roof face 84 extending upward from the edge 83 is inclined relative to the base plane 80 at an inclination angle $\alpha_{i+1}$. Different inclination angles $\alpha_i$, $\alpha_{i+1}$ may define different slopes of ascending roof faces. An inclination parameter value indicating the inclination $\alpha_{i+1}$ of the ascending roof face 84 is stored for edge 83 in the parametric description of the roof structure if the edge 83 has the first type identifier "A".

In order to determine the ridges between different roof faces, an intersection line 85 of the planar face 82 passing through the edge 81 and inclined at an angle $\alpha_i$ relative to the base plane and the planar face 84 passing through the edge 83 and inclined at an angle $\alpha_{i+1}$ relative to the base plane may be computed. The intersection line 85 defines an edge of the roof structure in 3D space. Similarly, a vertex 86 of the roof structure may be computed by determining intersections of two or more planar faces.

If an inclination parameter value is stored for an edge of the polygon to quantify the inclination of the respective face, the inclination angle may have any arbitrary value in a given interval, such as between 0° and 180°. Alternatively, a set of discretized allowed values may be used, with each one of the inclination parameter values stored in the description of the roof structure being selected from the discrete set.

Figure 10:
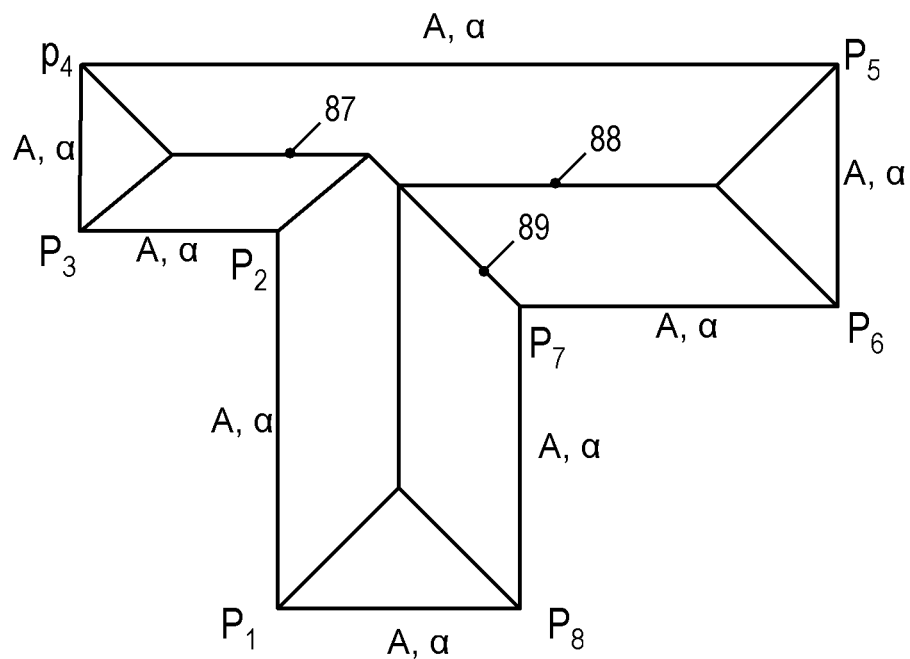
FIG. 10 is a plan view of a roof structure.

With reference to FIGS. 10-17, the generation and use of parametric descriptions for roof structures is illustrated. FIG. 10 is a plan view of a roof structure. The roof structure has a foot area which is not a regular polygon. The parametric description of roof structures in which type identifiers are assigned to edges allows the information on the roof structure to be represented in a compact manner.

The roof structure includes a total of eight ascending roof faces. Each of the roof faces may be inclined relative to the base plane of the roof structure by the same inclination angle $\alpha$. Different inclination angles may be readily accounted for.

As schematically indicated in FIG. 10, a polygon with points $p_1, \ldots, p_8$ is defined in the ground plane of the roof structure. The type identifier "A" is assigned to each edge of the polygon. As each roof face is inclined by the same angle $\alpha$ towards the interior of the polygon, a suitable inclination parameter value indicating the angle $\alpha$ is stored for each one of the edges.

Figure 11:
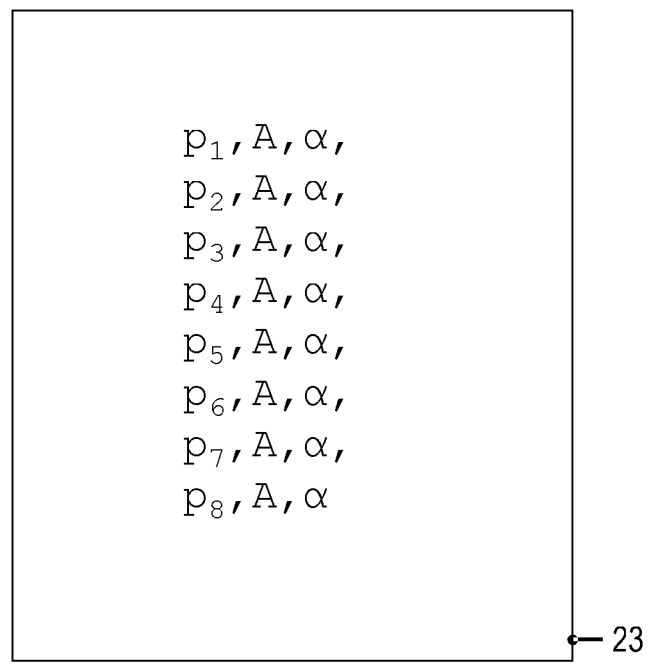
FIG. 11 illustrates data with a parametric description of the roof structure of FIG. 10.

FIG. 11 illustrates data 23 including a parametric description of the roof structure of FIG. 10. The data 23 includes information on the edges of the polygon, in the form of coordinates of the points $p_1, \ldots, p_8$, the type identifier "A" assigned to each one of the edges, and the inclination parameter value indicating the inclination angle $\alpha$.

Using the parametric description in the data 23, the roof structure of FIG. 10 can be reconstructed. Ridge lines 87, 88 or other edges 89 of the roof structure may be computed as lines in 3D by computing intersection lines of different planes passing through the various edges of the polygon, as explained with reference to FIG. 9.

Figures 12, 13:
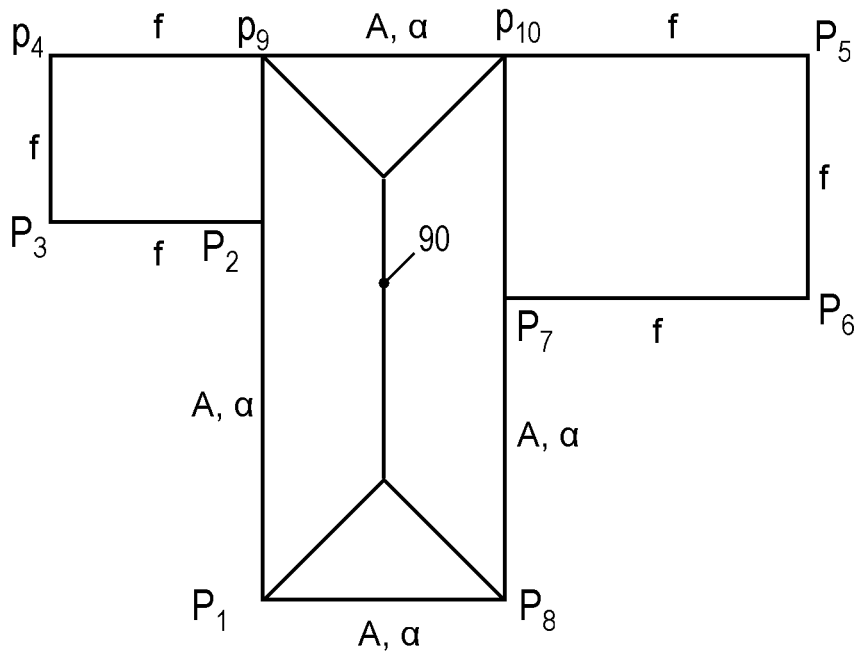
FIG. 12 is a plan view of a roof structure.
FIG. 13 illustrates data with a parametric description of the roof structure of FIG. 12.

FIG. 12 is a plan view of another roof structure. The roof structure has a foot area which is not a regular polygon. The parametric description of roof structures in which type identifiers are assigned to edges allows the information on the roof structure to be represented in a compact manner.

The roof structure includes ascending roof faces extending from the edge between points $p_1$ and $p_2$, the edge between points $p_2$ and $p_9$, the edge between points $p_9$ and $p_{10}$, the edge between points $p_{10}$ and $p_7$, the edge between points $p_7$ and $p_8$ and the edge between points $p_8$ and $p_1$. Each of these roof faces may be inclined relative to the base plane of the roof structure by the same inclination angle $\alpha$. Different inclination angles may be readily accounted for. The roof structure further includes two flat roofs disposed adjacent the ascending roof edges. Using the parametric description, the roof structure of FIG. 12 can be reconstructed. A ridge line 90 of the roof structure may be computed as a line in 3D by computing intersection lines of different planes passing through the various edges of the polygon.

FIG. 13 illustrates data 23 including a parametric description of the roof structure of FIG. 10. Three closed polygons are defined to describe the roof structure. One of the polygons includes all edges from which the ascending roof faces extend. The other two polygons include edges which respectively enclose a flat roof.

The data 23 includes information on the edges of the polygon, in the form of coordinates of the points $p_1, p_2, p_9, p_{10}, p_7, p_8$, the type identifier "A" assigned to each one of the edges, and the inclination parameter value indicating the inclination angle $\alpha$. The data 23 includes information on the edges of another polygon, in the form of coordinates of the points $p_2, p_3, p_4, p_9$, and the type identifier "f" assigned to each one of the edges. The data 23 also includes information on the edges of another polygon, in the form of coordinates of the points $p_{10}, p_5, p_6, p_7$, and the type identifier "f" assigned to each one of the edges. These two polygons with type identifiers "f" define the two flat roofs.

Figures 14, 15:
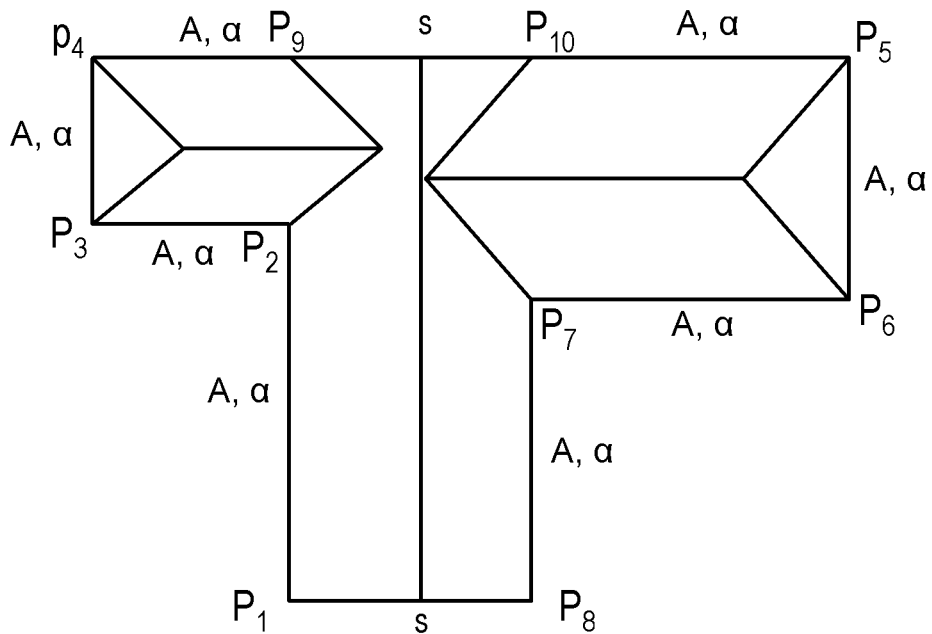
FIG. 14 is a plan view of a roof structure.
FIG. 15 illustrates data with a parametric description of the roof structure of FIG. 14.

FIG. 14 is a plan view of another roof structure. The roof structure has a foot area which is not a regular polygon. The parametric description of roof structures in which type identifiers are assigned to edges allows the information on the roof structure to be represented in a compact manner.

The roof structure includes plural ascending roof faces and two wall faces. The two wall faces extend from the edge of a polygon between points $p_9$ and $p_{10}$ and from the edge of the polygon between points $p_8$ and $p_1$. Most ascending roof faces are inclined relative to the base plane of the roof structure by the same inclination angle $\alpha$. The ascending roof faces extending from the edge between points $p_2$ and $p_9$ and from the edge between points $p_{10}$ and $p_7$ are inclined outwardly of the respective base polygon, so as to seamlessly abut on the adjacent ascending roof faces.

FIG. 15 illustrates data 23 including a parametric description of the roof structure of FIG. 14. Three closed polygons are defined to describe the roof structure. The data 23 includes information on the edges of a closed polygon, in the form of coordinates of the points $p_1, p_2, p_9, p_{10}, p_7, p_8$. The data 23 includes the type identifier "s" assigned to the edge from $p_9$ to $p_{10}$ and to the edge from $p_8$ to $p_1$. The data 23 includes the type identifier "A" for all other edges of the polygon and the inclination parameter value indicating the inclination angle $\alpha$.

The data 23 includes information on the edges of another polygon, in the form of coordinates of the points $p_2, p_3, p_4, p_9$, and the type identifier "A" assigned to each one of these edges. The data 23 includes an inclination parameter value indicating the inclination angle $\alpha$ for the edge extending from $p_2$ to $p_3$, for the edge extending from $p_3$ to $p_4$ and for the edge extending from $p_4$ to $p_9$, and an inclination parameter value indicating the inclination angle $180°-\alpha$ for the edge extending from $p_9$ to $p_2$.

The data 23 includes information on the edges of another polygon, in the form of coordinates of the points $p_{10}, p_5, p_6, p_7$, and the type identifier "A" assigned to each one of these edges. The data 23 includes an inclination parameter value indicating the inclination angle $\alpha$ for the edge extending from $p_{10}$ to $p_5$, for the edge extending from $p_5$ to $p_6$ and for the edge extending from $p_6$ to $p_7$, and an inclination parameter value indicating the inclination angle $180°-\alpha$ for the edge extending from $p_7$ to $p_{10}$.

Using the parametric description of the data 23, the roof structure of FIG. 14 can be reconstructed. It is not required to store information on vertices located at the top ridge of the roof structure in the database. Locations of such vertices in 3D space may be determined when reconstructing the roof structure, using the parametric description of the roof structure.

Figure 16:
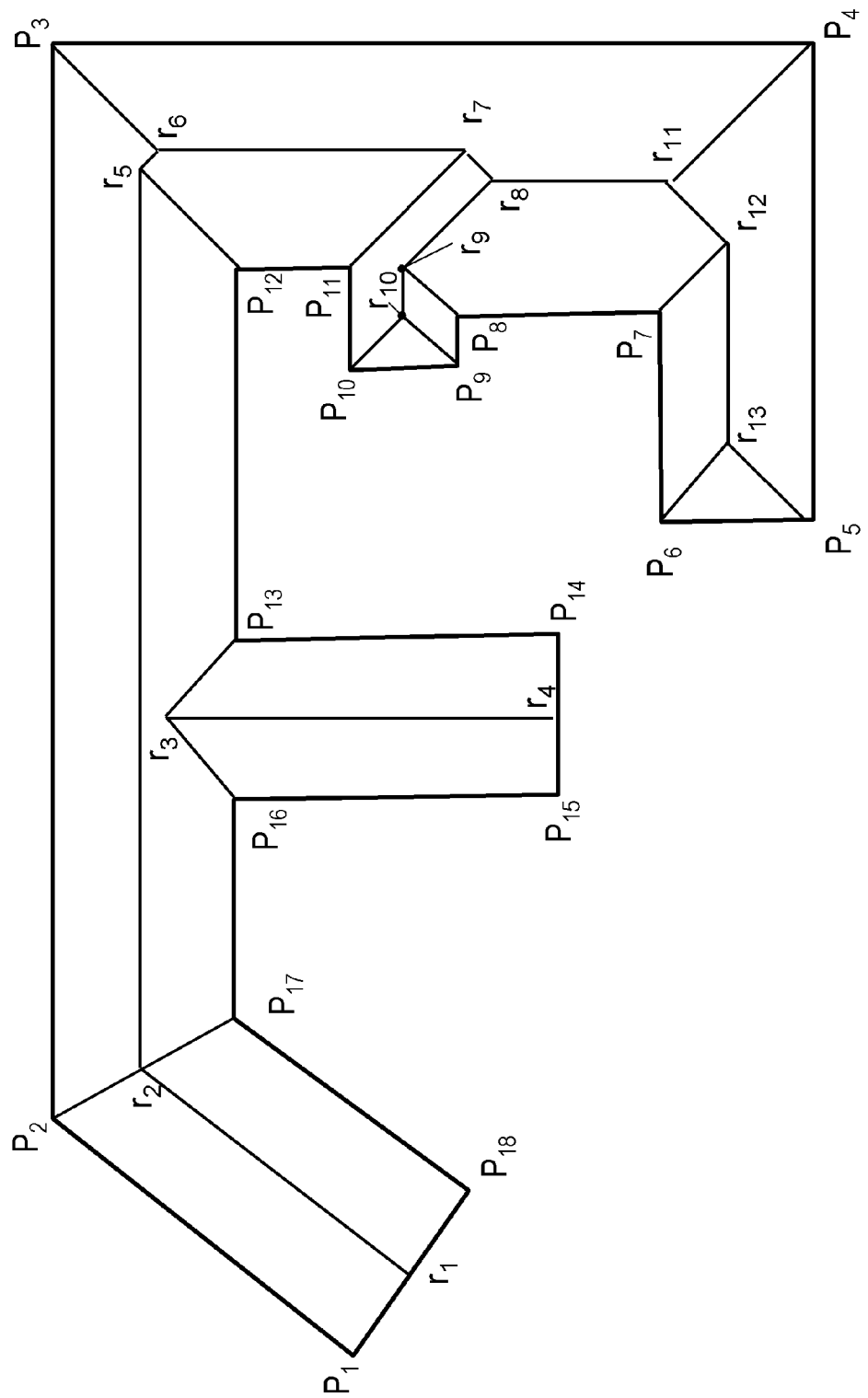
FIG. 16 is a plan view of a roof structure.

FIG. 16 is a plan view of another roof structure. The roof structure has a foot area which is not a regular polygon. The parametric description of roof structures in which type identifiers are assigned to edges allows the information on the roof structure to be represented in a compact manner.

The foot area of the roof structure is defined by a polygon with corners, or vertices, $p_1, \ldots, p_{18}$. The roof structure includes plural ascending roof faces and two wall faces. The two wall faces extend from the edge between points $p_{14}$ and $p_{15}$ and from the edge of the polygon between points $p_{18}$ and $p_1$. All ascending roof faces are inclined relative to the base plane of the roof structure by the same inclination angle $\alpha$.

FIG. 17 illustrates data 23 including a parametric description of the roof structure of FIG. 16. One closed polygons is defined to describe the roof structure.

The data 23 includes information on the edges of the polygon, in the form of coordinates of the points $p_1, \ldots, p_{18}$. The data 23 includes the type identifier "s" assigned to the edge from $p_{14}$ to $p_{15}$ and to the edge from $p_{18}$ to $p_1$. The data 23 includes the type identifier "A" for all other edges of the polygon and the inclination parameter value indicating the inclination angle α.

Using this parametric description, the roof structure may be reconstructed. It is not required to store coordinates of vertices $r_1, \ldots, r_{13}$ of the roof structure in the database. Ridges and upper vertices of the roof structure may be computed from the parametric description in data 23 by computing the intersection lines between planes passing through different edges of the polygon defined in the base plane of the roof structure.

FIG. 18 illustrates, for comparison, a possible conventional description of the roof structure of FIG. 16. In the data 91, each planar face of the roof structure is defined by the coordinates of the vertices of the face. This requires the coordinates of vertices of the roof structure, such as vertices $r_1, \ldots, r_{13}$, to be also stored in the data 91. For the roof structure of FIG. 16, the conventional description is less compact than the parametric description according to embodiments.

The parametric description of roof structures and the method of outputting 3D roof structures may further be configured such that dormers may be readily accounted for. To this end, a convention may be introduced that the length of the edge of the polygon may also be zero in the parametric description of the roof structure, that is two vertices of the polygon may be allowed to coincide. The method of outputting 3D roof structures may then use the convention that, if an edge of the polygon has zero length, a face of the roof structure is constructed which extends from a virtual edge that is orthogonal to the preceding edge of the closed polygon. The description of dormers is thus readily integrated into the parametric description, as will be explained in more detail with reference to FIGS. 19 and 20.

Figure 19:
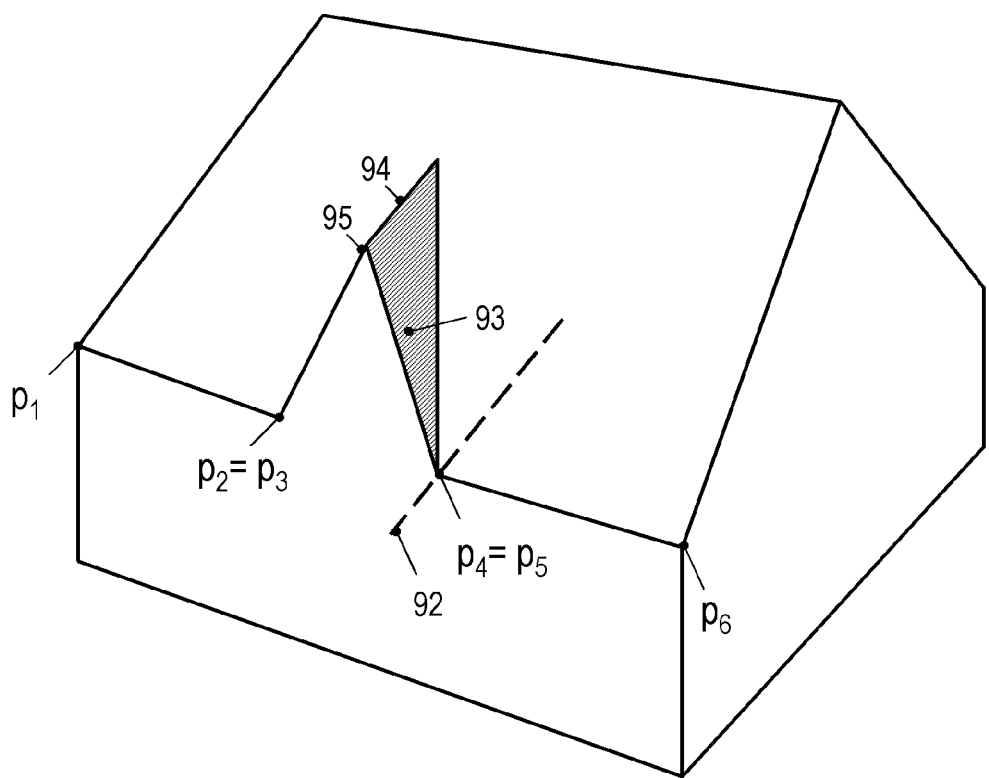
FIG. 19 is a schematic perspective view of a reconstructed roof structure.
Figure 20:
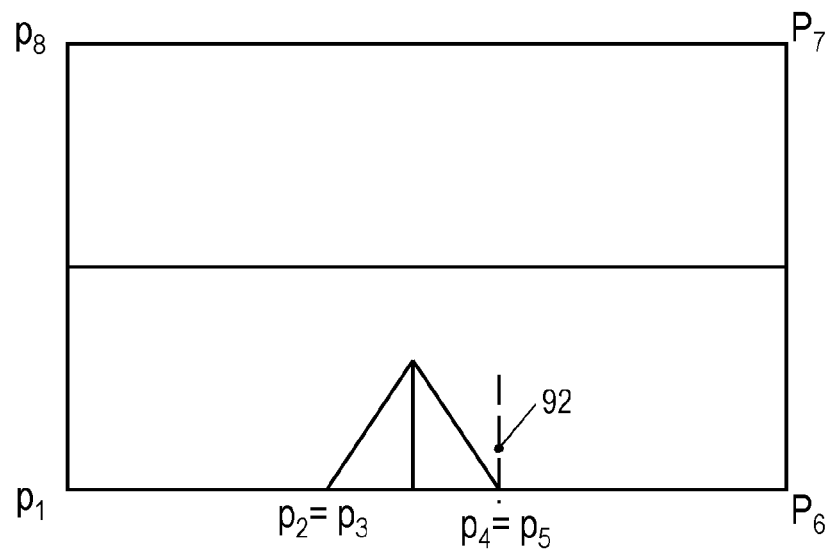
FIG. 20 is a top view of the roof structure of FIG. 19.

FIG. 19 is a schematic perspective view of a reconstructed 3D roof structure and FIG. 20 is a plan view of the roof structure. A parametric description of the roof structure includes a polygon defined in the base plane of the roof structure with vertices $p_1, p_2, p_3, p_4, p_5, p_6, \ldots$. Some of the edges of the polygon are set to have zero length by defining $p_2 = p_3$ and $p_4 = p_5$. By convention, when reconstructing the roof structure from the parametric description, a face of the roof structure is generated using the type identifier and, where applicable, parameter value(s) for the zero length edge from $p_2$ to $p_3$, while generating the face as if the edge of the polygon from $p_2$ to $p_3$ were oriented perpendicular to the preceding edge from $p_1$ to $p_2$. Similarly, another face of the roof structure is generated using the type identifier and, where applicable, parameter value(s) for the zero length edge from $p_4$ to $p_5$, while generating the face as if the edge of the polygon from $p_4$ to $p_5$ were oriented perpendicular to the preceding edge from $p_3$ to $p_4$.

By assigning the type identifier "A" and an inclination parameter value to the edges having zero length, a roof structure having a dormer may be reconstructed. Referring to FIGS. 19 and 20, the type identifier "A" and an inclination parameter may be assigned to the zero length edge from $p_2$ to $p_3$. The type identifier "s" may be assigned to the edge from $p_3$ to $p_4$. The type identifier "A" and an inclination parameter may be assigned to the zero length edge from $p_4$ to $p_5$.

Using the convention that a zero length edge of the polygon is treated as if it were oriented orthogonal to the preceding edge in the plane of the polygon, the roof face 93 of the dormer is reconstructed. The roof face 93 passes through a line 92 which lies in the plane of the polygon and is normal to the preceding edge from $p_3$ to $p_4$. The roof face 93 is inclined relative to the plane in which the polygon is defined in accordance with the inclination parameter value stored for the edge from $p_4$ to $p_5$. A ridge line 94 and upper vertex 95 of the roof structure may be determined by computing intersection lines between faces generated based on the parametric description of the roof structure.

While embodiments have been described in which, depending on the type identifier assigned to an edge, a plane face is generated which is inclined relative to the base plane in which the polygon is defined (type identifier "A"), or which is normal to the base plane in which the polygon is defined (type identifier "s"), or which lies within the base plane in which the polygon is defined (type identifier "f"), the description of roof structures and the methods and devices using the same may also be employed to define more complex roof structures having broken faces. As used herein, a broken roof face is understood to be a roof face having plural ascending planar faces, which are inclined to the base plane at different inclination angles. This will be explained in more detail with reference to FIGS. 21-30.

Figure 21:
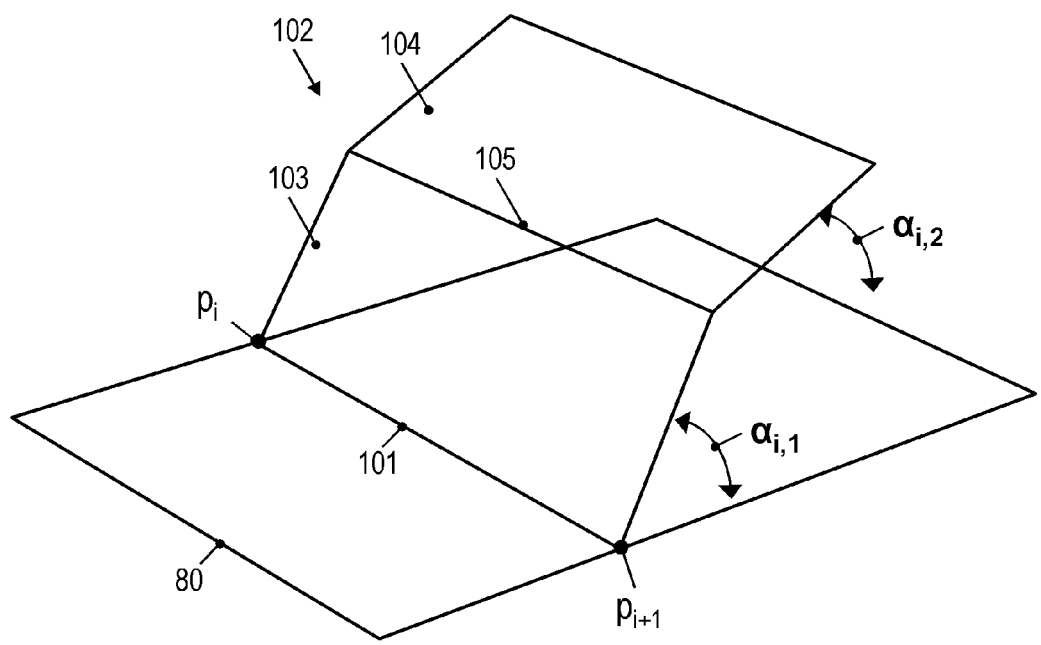
FIG. 21 is a schematic perspective view illustrating a broken roof face having plural planar faces.

FIG. 21 illustrates an example for such a broken roof face 102. The broken roof face 101 includes two planar faces 103 and 104 inclined at different angles $\alpha_{i,1}$ and $\alpha_{i,2}$ relative to a base plane 80 of the roof structure. An edge 105 at which the two planar faces 103 and 104 meet extends parallel to the lower end side of the face 103.

In a parametric description of a roof structure which includes the broken roof face 102, information on a closed polygon is stored. The information includes information on an edge 101 of the closed polygon. A type identifier "A" may be stored for the edge 101 to indicate that an ascending roof face extends from the edge 101. More than one parameter value may be stored for the edge 101. The parameter values stored for the edge 101 may include a first inclination parameter value indicative of the inclination angle $\alpha_{i,1}$, a second inclination parameter value indicative of the inclination angle $\alpha_{i,2}$, and a displacement parameter value indicative of the position of the edge 105 between the two faces 103 and 104 relative to the edge 101 of the polygon.

The displacement parameter value may take any one of a variety of forms. For illustration, a height of the edge 105 measured from the base plane 80 may be stored. Alternatively or additionally, a displacement of the edge 105 from the edge 101 of the polygon in a direction normal to the edge 101 of the polygon, measure in a direction parallel to the base plane 80, may be stored. Alternatively or additionally, a distance of the edge 105 between the planar faces of the broken roof face from the edge 101 of the polygon may be stored. As the inclination angle $\alpha_{i,1}$ of the planar face 103 is known, any one of these values allows the position of the edge 105 to be determined relative to the edge 101.

Figure 22:
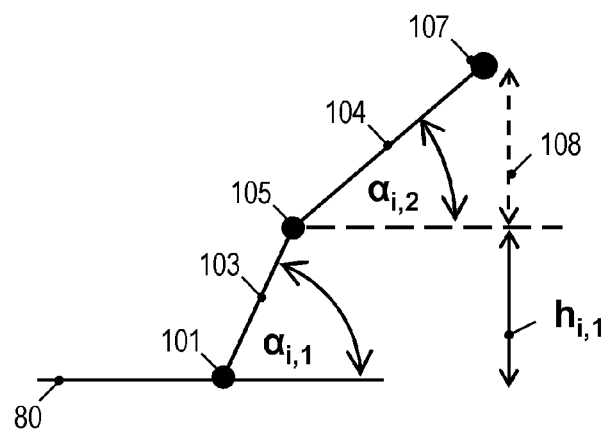
FIG. 22 is a side view of the broken roof face of FIG. 21.

FIG. 22 is a side view of the broken roof face 102 of FIG. 21. Illustrated is the height hi,1 of the edge 105 above the lower edge 101 of the polygon. This height may be stored as an attribute for the edge 101 in the map database. It is not required to store information specifying the upper ridge 107 of the planar face 104. The ridge 107 may be determined by computing intersection lines between the broken roof face 102 and other faces defined by the parametric description of the roof structure.

Figures 23, 24:
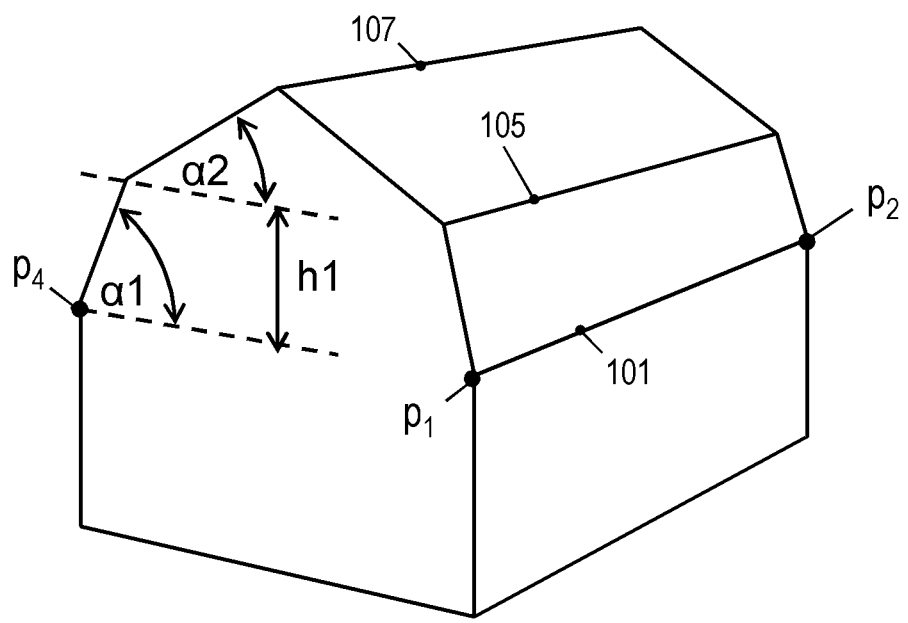
FIG. 23 is a schematic perspective view of a reconstructed roof structure including broken roof faces.
FIG. 24 shows a parametric description of the roof structure of FIG. 23.

FIG. 23 is a schematic perspective view of a reconstructed roof structure which has two broken roof faces and two wall faces. The inclination angle of the lower planar face of the two broken ascending roof faces has a value of $\alpha 1$, and the inclination of the upper planar face of the two broken wall faces has a value of $\alpha 2$ relative to the base plane of the roof structure. The edge 105 between the two planar faces is disposed at a height h1 above the base plane of the roof structure. A closed polygon with corner points $p_1, \ldots p_4$ is defined in the base plane of the roof structure. An edge 101 extends from $p_1$ to $p_2$ at the lower end side of a broken roof face.

FIG. 24 shows data 23 which provide a parametric description of the roof structure of FIG. 23. The first type identifier "A" is assigned to the edge extending from $p_1$ to $p_2$ and to the edge extending from $p_3$ to $p_4$. Three parameter values are stored for each one of these two edges which include inclination parameter values indicative of the two inclinations and a displacement parameter value indicative of the displacement of the edge 105 relative to the edge 101 of the polygon. The second type identifier "s" is assigned to the edge from $p_2$ to $p_3$ and to the edge extending from $p_4$ to $p_1$.

Using the parametric description of the data 23, the roof structure of FIG. 23 may be reconstructed. The location of the edge 105 may be determined using the parameter values stored for the edge from $p_1$ to $p_2$. The location of the ridge 107 may be computed as intersection line between the two broken roof faces.

Figure 25:
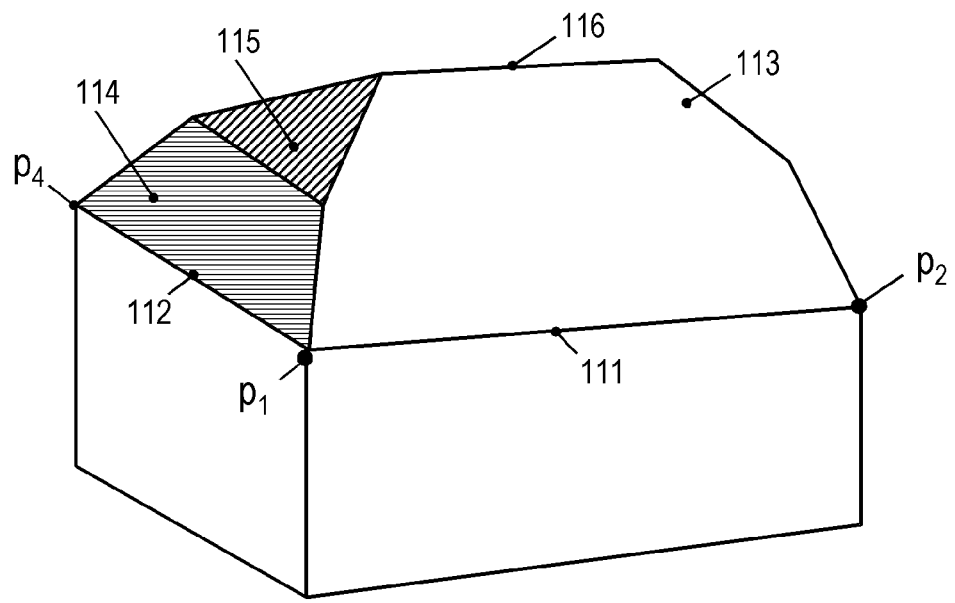
FIG. 25 is a schematic perspective view of another reconstructed roof structure having broken roof faces.
Figure 26:
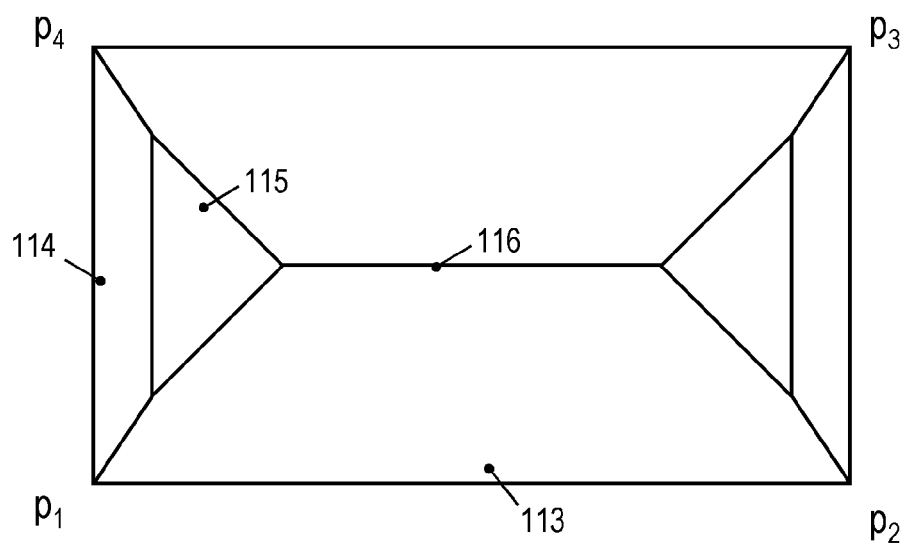
FIG. 26 is a plan view of the roof structure of FIG. 25.

FIG. 25 is a schematic perspective view of a reconstructed roof structure which has two broken ascending roof faces and two ascending roof faces which are not broken. FIG. 26 is a plan view of the roof structure. Each one of the broken roof faces includes a first ascending planar face 114 extending from an edge 112 and a second ascending planar face 115. A planar face 113 which is not broken extends from the other edges 111 of the polygon used for describing the roof structure.

The inclination angle of the lower planar face 114 of the broken roof faces has a value of $\alpha 1$, and the inclination of the upper planar face 115 of the broken roof faces has a value of $\alpha 2$ relative to the base plane of the roof structure. The edge between the two planar faces of the broken roof faces is disposed at a height h1 above the base plane of the roof structure. The planar face 113 is also assumed to have an inclination of $\alpha 1$ relative to the base plane.

A closed polygon with corner points $p_1, \ldots p_4$ is defined in the base plane of the roof structure. An edge 111 of the polygon extends from $p_1$ to $p_2$ at the lower end side of an ascending roof face which is not broken. An edge 112 of the polygon extends from $p_4$ to $p_1$ at the lower end side of the ascending roof face which is broken.

Figure 27:
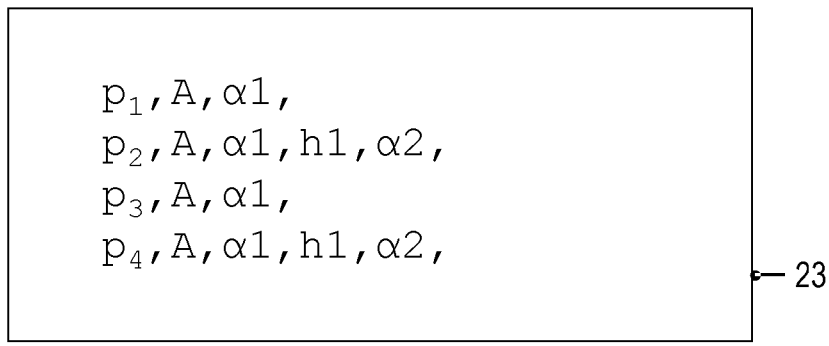
FIG. 27 illustrates data with a parametric description of the roof structure of FIGS. 25 and 26.

FIG. 27 shows data 23 which provide a parametric description of the roof structure of FIGS. 25 and 26. The first type identifier "A" is assigned to each one of the edges of the polygon. One parameter value indicating the inclination of the ascending roof face that is not broken is respectively stored for the edge extending from $p_1$ to $p_2$ and for the edge extending from $p_3$ to $p_4$. Three parameter values are respectively stored for the edge from $p_2$ to $p_3$ and for the edge from $p_4$ to $p_1$. The three parameter values include inclination parameter values indicative of the two inclinations and a displacement parameter value indicative of the displacement of the edge between the two planar faces of the broken face relative to the edge 112 of the polygon.

Using the parametric description of the data 23, the roof structure of FIG. 25 may be reconstructed. The location of all edges between ascending roof faces may be determined using the parametric description. To this end, intersection lines between the faces may be determined. It is not required to store, for example, the position of the ridge line 116 as a separate parameter.

When reconstructing the roof structure, the processing device 2 of the navigation system 1 may determine whether an ascending roof face is a broken face based on whether an edge of the polygon has the type identifier "A" and then further based on the number of parameters stored for the respective edge.

Even more complex roof structures may be stored using the parametric description of roof structures in which type identifiers and parameter values are assigned to edges of a polygon. For illustration, onion-type dome structures as found at church towers built in the Baroque epoch may be stored.

Figure 28:
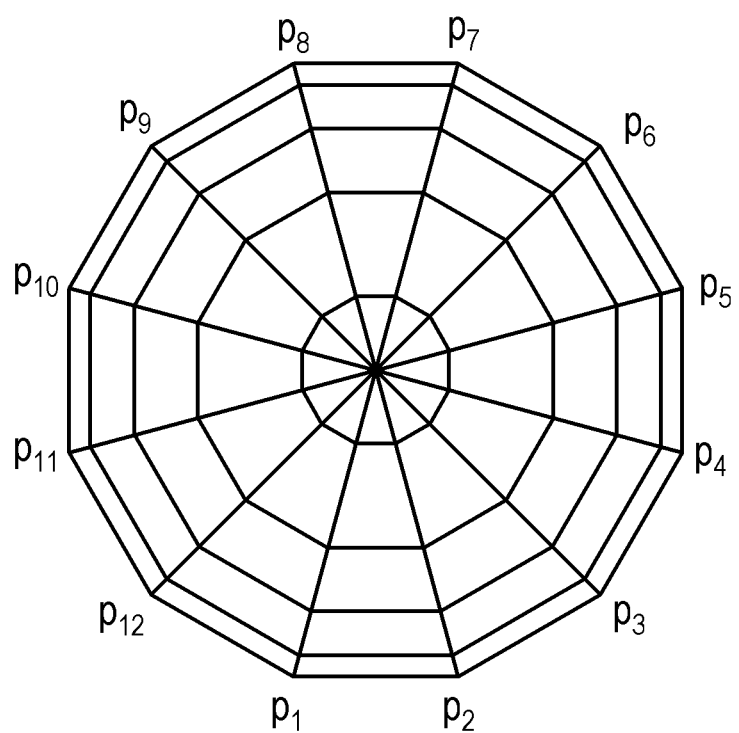
FIG. 28 is a plan view of an onion-dome roof structure.
Figures 29, 30:
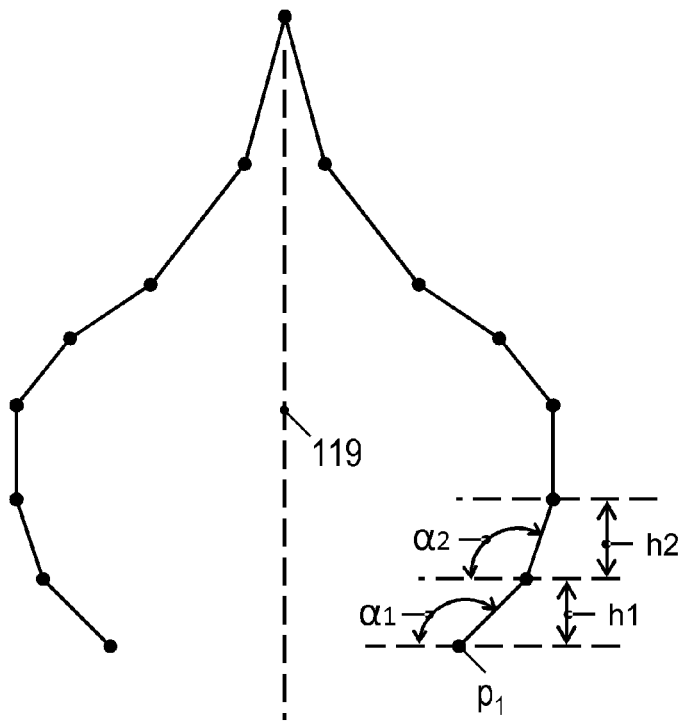
FIG. 29 is a sectional view taken along a vertical plane through the onion-dome roof structure of FIG. 28.
FIG. 30 illustrates data with a parametric description of the roof structure of FIGS. 28 and 29.

FIG. 28 is a plan view of such an onion-type roof structure, and FIG. 29 is a sectional view through a center axis 119 of the onion-type dome. The roof structure may be described, using the parametric description explained herein, in terms of broken roof faces.

The onion-type roof structure is symmetric under 30° rotations about the center axis 119. A regular polygon having twelve edges may be defined. The twelve edges of the polygon represent the footprint of the onion-type roof structure. For each one of the edges of the polygon, the first type identifier "A" and plural parameter values may be stored in the database. The plural parameter values may indicate, for example, the inclination angles of the plural planar faces relative to the base plane as well as information quantifying the displacement of the upper and lower edges of the planar faces.

Referring to FIG. 29, the lowermost planar face which extends upward from the edge between points $p_1$ and $p_2$ of the polygon has an inclination angle $\alpha 1$ relative to the base plane. The lowermost planar face extends upward over a height of h1. The adjacent planar face extends upward from the edge extending at height h1, and at an inclination angle $\alpha 2$ relative to the base plane. This planar face extends upward by a total height of h2. Corresponding parameters may be defined for each one of the adjacent planar faces that are disposed towards the upper point of the onion-type roof structure. Thereby, a total of seven inclination angles $\alpha 1, \ldots, \alpha 7$ may be defined. Similarly, a total of six heights h1, . . . , h6 may be defined. It is not required to separately store the height h7 of the topmost planar faces of the broken roof faces, because this height can be concluded by intersecting the different broken roof faces. Due to the symmetry of the onion-type dome structure, these inclination angle parameters and heights are the same for each one of the twelve edges of the polygon.

FIG. 30 shows data 23 which provide a parametric description of the onion-type dome structure. The first type identifier "A" is assigned to each one of the edges of the polygon. Further, plural parameter values are stored for each one of the edges of the polygon. The parameter values include inclination parameter values indicative of the seven inclination angles $\alpha 1, \ldots, \alpha 7$ and displacement parameter values h1, . . . , h6 indicative of the displacement between edges at which different planar faces of the broken roof face abut on each other.

Using the parametric description of the data 23, the onion-type dome structure may be reconstructed. The location of all edges between the various ascending roof faces may be determined using the parametric description. When reconstructing the roof structure, the processing device 2 of the navigation system 1 may determine that all ascending roof face are broken faces based on the type identifier "A" and the number of parameters stored for the respective edge.

Methods and devices for outputting 3D roof structures have been described and illustrated with reference to exemplary roof structures. The various principles described may not only be utilized when generating optical output based on the parametric description of roof structures, but also when generating a database which includes such a parametric description of roof structures.

Figure 31:
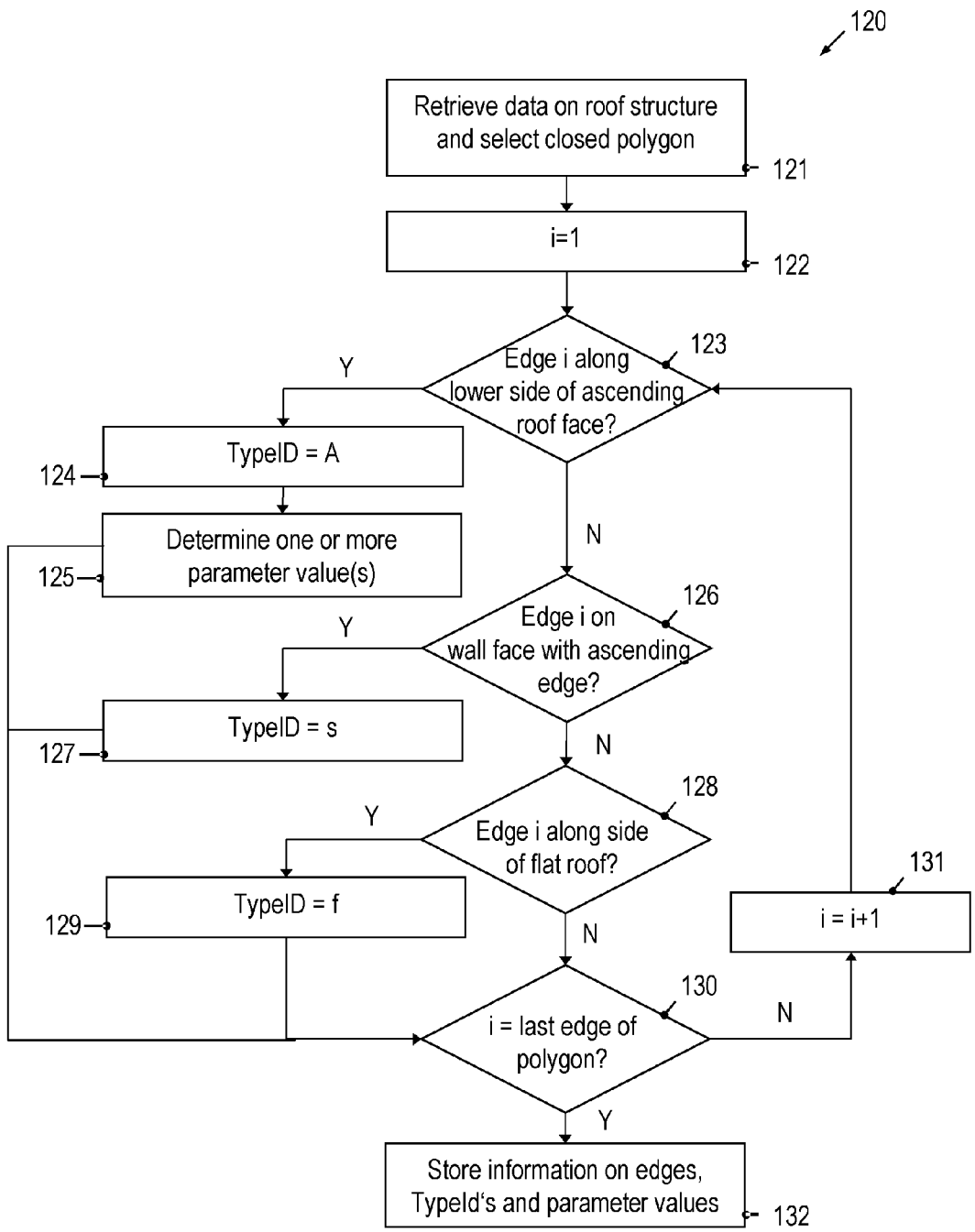
FIG. 31 is a flow chart of a method of generating a navigation system database.

FIG. 31 shows a flow chart of a method 120 of generating a database. The database is generated to include a parametric description of roof structures, with type identifiers assigned to edges of a closed polygon. At act 121, data representing a roof structure are retrieved and at least one polygon is defined. The data may be pre-processed data which already include information on planar faces of the roof structure. Alternatively, the data may also be raw data which is then pre-processed to determine planar faces of the roof structure. The closed polygon may be defined based on the data representing the roof structure and, in particular, based on a segmentation of the roof structure into planar faces. If the roof structure includes one or more flat roofs, a closed polygon with edges enclosing each flat roof may respectively be defined.

At act 122, an iteration over edges of the polygon is initialized. At act 123, it is determined whether the $i^{th}$ edge of the polygon is disposed on a lower end side of an ascending roof face. If the edge is disposed on a lower end side of an ascending roof face, at act 124, the type identifier for the edge is set to have value "A". At act 125, one or more parameter values are determined. The parameter values include at least one inclination parameter indicating an inclination angle of the roof face on which the edge i of the polygon extends. The method then proceeds to act 130.

If, at act 123, it is determined that the $i^{th}$ edge of the polygon is not disposed on a lower end side of an ascending roof face, the method proceeds to act 126. At act 126, it is determined whether the edge extends on a wall face which has ascending wall edges to support roof faces. If the edge extends on a wall face, at act 127, the type identifier for the edge is set to have value "s". The method then proceeds to act 130.

If, at act 126, it is determined that the $i^{th}$ edge of the polygon does not extends on a wall face having ascending wall edges, the method proceeds to act 128. At act 128, it is determined whether the edge extends along a side of a flat roof. If the edge extends along the side of a flat roof, at act 129, the type identifier for the edge is set to have value "f". The method then proceeds to act 130.

At act 130, it is determined whether the assigning of type identifiers and, if applicable, parameter values has been performed for all edges of the closed polygon. If the $i^{th}$ edge is not the last edge, the edge index is incremented at act 131. The method returns to act 123.

If it is determined that type identifiers and, if applicable, parameter values have been assigned to all edges of the polygon, information on the edges, the type identifiers assigned to the edges, and the parameter values are stored in the database. If more than one polygon is defined at act 121, the procedure acts 122-132 may be repeated for each one of the polygons. The map database generated using the method of FIG. 31 may be used in a navigation system according to an embodiment.

While devices and methods according to embodiments have been described in detail, modifications may be implemented in other embodiments. For illustration, while embodiments using three type identifiers have been described, another number of type identifiers, or type identifiers having other meanings, may be used. For illustration, rather than defining a separate type identifier for flat roofs, a convention could be employed that a roof face with type identifier "A" and inclination parameter value of 0° corresponds to a flat roof. In further embodiments, more than three type identifiers may be used. For illustration, a separate type identifier may be introduced for ascending roof faces which are broken.

Embodiments of the invention may be used for navigation systems. However, according to further aspects and embodiments, parametric descriptions of roof structures in which a type identifiers is respectively assigned to an edge of a closed polygon may also be used in any other application in which a 3D city model is to be output.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A navigation system, comprising:
an optical output device;
a database storing data which defines three-dimensional roof structures, the database being a relational database; and
a processing device coupled to the database, the processing device configured to retrieve data defining a three-dimensional roof structure from the database, to reconstruct the three-dimensional roof structure based on the retrieved data and to control the optical output device to display the reconstructed roof structure,
wherein the retrieved data includes information on each edge of a plurality of edges of at least one closed polygon and a type identifier respectively stored in the database for each edge of the plurality of the edges, at least a subset of the type identifiers for the edges being stored as attributes in the relational database, each one of the type identifiers being respectively selected from a finite set of type identifiers which includes a first type identifier for an ascending roof face, a second type identifier for a planar face which is oriented normal to a base plane, and a third type identifier for a flat roof;
wherein the retrieved data includes parameter values for each edge of the plurality of edges, the parameter values being different from the type identifiers, each one of the parameter values being respectively stored for an edge of the plurality of edges of the polygon;
the processing device configured to determine plural planar faces to reconstruct the roof structure, each one of the planar faces respectively being determined such that it passes through an edge of the polygon and has an orientation determined based on the type identifier stored for the edge; and
the processing device configured to reconstruct the three-dimensional roof structure based on at least the information on the plurality of edges, the type identifiers for the edges, and the plural planar faces.

2. The navigation system of claim 1,
the processing device being further configured to reconstruct the roof structure based on the parameter values.

3. The navigation system of claim 2, the processing device being configured to, when reconstructing the roof structure, identify an edge of the polygon for which the first type identifier is stored in the database, to retrieve at least one inclination parameter value for the identified edge and to generate an inclined roof face having a planar face, the planar face passing through the identified edge and having an inclination defined by the inclination parameter value.

4. The navigation system of claim 3, the processing device being configured to identify a second edge of the polygon for which the first type identifier is stored in the database, to retrieve a second inclination parameter value for the identified second edge, and to compute an intersection line between the roof face and a second roof face, the second roof face including a second planar face which passes through the second edge and has an inclination defined by the second inclination parameter value.

5. The navigation system of claim 3, the processing device being configured to determine whether a further inclination parameter value is stored for the identified edge and, if a further inclination parameter value is stored for the identified edge, to generate the roof face as a broken roof face which has a further planar face, where the further planar face is parallel to the identified edge of the polygon and has a further inclination defined by the further inclination parameter value.

6. The navigation system of claim 1, the processing device being configured to identify an edge of the polygon for which the second type identifier is stored in the database and to reconstruct the roof structure such that it includes a planar face which is oriented normal to a base plane, passes through the identified edge and has an ascending wall edge inclined relative to the base plane.

7. The navigation system of claim 6, the processing device being configured to compute an intersection line between a plane and a further plane in order to compute the ascending wall edge, where the plane passes through the identified edge and is normal to the base plane, and where the further plane passes through another edge of the polygon adjacent the identified edge and is inclined relative to the base plane.

8. The navigation system of claim 1, the processing device being configured to identify edges of the polygon for which the third type identifier is stored in the database and to reconstruct the roof structure such that it includes a flat roof enclosed by the identified edges of the polygon.

9. The navigation system of claim 1, where the finite set of type identifiers includes three different type identifiers.

10. The navigation system of claim 1, where the polygon is disposed in a base plane of the roof structure.

11. A method of outputting a three-dimensional roof structure via an optical output device of a navigation system, the method comprising:
retrieving data representing a three-dimensional roof structure from a database which is a relational database, where the retrieved data includes:
information on each edge of a plurality of edges of at least one closed polygon;
a type identifier respectively stored in the database for each edge of the plurality of edges, each one of the type identifiers being selected from a finite set of type identifiers which includes a first type identifier for an ascending roof face, a second type identifier for a planar face which is oriented normal to a base plane, and a third type identifier for a flat roof, at least a subset of the type identifiers for the edges being stored as attributes in the relational database; and
parameter values for each edge of the plurality of edges, each one of the parameter values being respectively stored for an edge of the plurality of edges of the polygon, the parameter values being different from the type identifiers;
reconstructing the three-dimensional roof structure based on the information on the plurality of edges and the type identifiers for the edges, where plural planar faces are determined so that the respective planar face passes through an edge of the polygon and has an orientation determined based on the type identifier stored for the edge; and
controlling the optical output device to display the reconstructed roof structure.

12. The method of claim 11, where the method is performed by a navigation system, the navigation system comprising:
an optical output device;
a database storing data which defines three-dimensional roof structures, the database being a relational database; and
a processing device coupled to the database, the processing device configured to retrieve data defining a three-dimensional roof structure from the database, to reconstruct the three-dimensional roof structure based on the retrieved data and to control the optical output device to display the reconstructed roof structure.

13. A method of generating a vehicle navigation database including a parametric description of roof structures, the method comprising:
retrieving data, using a processor, representing a three-dimensional roof structure;
identifying, based on the data, at least one closed polygon including a plurality of edges in a base plane of the roof structure;
for each edge of the plurality of edges:
assigning a type identifier selected from a finite set of type identifiers to the edge based on a position of the edge relative to roof faces of the roof structure, wherein the set of type identifiers includes a first type identifier, a second type identifier, and a third type identifier; and
determining a parameter value for each respective edge of a plurality of edges from the data, the determined parameter value being different from the type identifier; and
storing information on the plurality of edges of the polygon, on the type identifiers assigned to each of the edges, and on the determined parameter values for each edge of the plurality of edges of the polygon in the database,
wherein the database comprises a relational database and at least a subset of the type identifiers for the edges are stored as attributes in the relational database; and
wherein the three-dimensional roof structure is reconstructed, by the processor, based on at least the information on the plurality of edges and the type identifiers assigned to each of the edges stored in the database.

14. The method of claim 13,
where the first type identifier is assigned to an edge of the polygon if the edge extends along a lower end side of an inclined roof face, where the second type identifier is assigned to an edge of the polygon if the edge extends across a wall face having an ascending wall edge to support an ascending roof face, and where the third type identifier is assigned to an edge of the polygon if the edge extends along a side of a flat roof face.

15. A navigation system, comprising:
an optical output device;
a database storing data which defines three-dimensional roof structures, the database being a relational database; and
a processing device coupled to the database, the processing device being configured to retrieve data defining a three-dimensional roof structure from the database, to reconstruct the three-dimensional roof structure based on the retrieved data and to control the optical output device to display said reconstructed roof structure;
where the retrieved data includes information on edges of at least one closed polygon and a type identifier respectively stored in the database for each one of the edges, at least a subset of the type identifiers for the edges being stored as attributes in the relational database, each one of the type identifiers being respectively selected from a finite set of type identifiers;
the processing device being configured to determine plural planar faces to reconstruct the roof structure, each one of the planar faces respectively being determined such that it passes through an edge of the polygon and has an orientation determined based on the type identifier stored for the edge;
where the retrieved data includes parameter values for each edge of a plurality of edges, the parameter values being different from the type identifiers, each one of the parameter values being respectively stored for an edge of the plurality of edges of the polygon; and
the processing device configured to reconstruct the roof structure in an iterative procedure based on the parameter values and based on the type identifiers stored in the database.

16. The navigation system of claim 15, the finite set of type identifiers including at least a first type identifier for an ascending roof face and a second type identifier for a planar face which is oriented normal to a base plane.

17. The navigation system of claim 15, the processing device being configured to, when reconstructing the roof structure, identify an edge of the polygon for which a first type identifier is stored in the database, to retrieve at least one inclination parameter value for the identified edge and to generate an inclined roof face having a planar face, the planar face passing through the identified edge and having an inclination defined by the inclination parameter value.

18. The navigation system of claim 17, the processing device being configured to identify a second edge of the polygon for which the first type identifier is stored in the database, to retrieve a second inclination parameter value for the identified second edge, and to compute an intersection line between the roof face and a second roof face, the second roof face including a second planar face which passes through the second edge and has an inclination defined by the second inclination parameter value.

19. The navigation system of claim 17, the processing device being configured to determine whether a further inclination parameter value is stored for the identified edge and, if a further inclination parameter value is stored for the identified edge, to generate the roof face as a broken roof face which has a further planar face, where the further planar face is parallel to the identified edge of the polygon and has a further inclination defined by the further inclination parameter value.

20. The navigation system of claim 15, the processing device being configured to identify an edge of the polygon for which the second type identifier is stored in the database and to reconstruct the roof structure such that it includes a planar face which is oriented normal to a base plane, passes through the identified edge and has an ascending wall edge inclined relative to the base plane.

21. The navigation system of claim 20, the processing device being configured to compute an intersection line between a plane and a further plane in order to compute the ascending wall edge, where the plane passes through the identified edge and is normal to the base plane, and where the further plane passes through another edge of the polygon adjacent the identified edge and is inclined relative to the base plane.

22. A non-transitory computer-readable storage medium including instructions that, when executed by a processor, cause the processor to output a three-dimensional roof structure via an optical output device of a navigation system by performing the steps of:
retrieving data representing a three-dimensional roof structure from a database which is a relational database, where the retrieved data includes:
information on each edge of a plurality of edges of at least one closed polygon;
a type identifier respectively stored in the database for each edge of the plurality of edges, each one of the type identifiers being selected from a finite set of type identifiers which includes a first type identifier for an ascending roof face, a second type identifier for a planar face which is oriented normal to a base plane, and a third type identifier for a flat roof, at least a subset of the type identifiers for the edges being stored as attributes in the relational database; and
parameter values for each edge of the plurality of edges, each one of the parameter values being respectively stored for an edge of the plurality of edges of the polygon, the parameter values being different from the type identifiers;
reconstructing the three-dimensional roof structure based on the information on the plurality of edges and the type identifiers for the edges, where plural planar faces are determined so that the respective planar face passes through an edge of the polygon and has an orientation determined based on the type identifier stored for the edge; and
controlling the optical output device to display the reconstructed roof structure.

* * * * *